(12) United States Patent  
Yamaji

(10) Patent No.: US 8,860,172 B2
(45) Date of Patent: Oct. 14, 2014

(54) HIGH VOLTAGE SEMICONDUCTOR DEVICE

(71) Applicant: Fuji Electric Co., Ltd, Kawasaki (JP)

(72) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 14/204,909

(22) Filed: Mar. 11, 2014

(65) Prior Publication Data

US 2014/0191281 A1 Jul. 10, 2014

Related U.S. Application Data

(63) Continuation of application No. PCT/JP2012/073426, filed on Sep. 13, 2012.

(30) Foreign Application Priority Data

Sep. 16, 2011 (JP) ................. 2011-202681

(51) Int. Cl.
*H01L 21/70* (2006.01)
*H01L 29/739* (2006.01)
*H01L 29/78* (2006.01)
*H01L 21/761* (2006.01)

(52) U.S. Cl.
CPC ........ *H01L 29/7393* (2013.01); *H01L 29/7816* (2013.01); *H01L 21/761* (2013.01); *H01L 29/7832* (2013.01)
USPC ............ 257/500; 257/409; 257/502; 257/504

(58) Field of Classification Search
CPC .................. H01L 21/761; H01L 29/7832
USPC .................. 257/409, 500, 502, 504
See application file for complete search history.

(56) References Cited

U.S. PATENT DOCUMENTS

| 5,894,156 | A | 4/1999 | Terashima et al. |
| 8,368,141 | B2 * | 2/2013 | Yamaji ............ 257/339 |
| 8,674,729 | B2 * | 3/2014 | Yamaji ............ 327/109 |
| 2002/0014905 | A1 | 2/2002 | Kumagai |
| 2007/0085595 | A1 | 4/2007 | Taki et al. |
| 2010/0148823 | A1 | 6/2010 | Shimizu |
| 2011/0133269 | A1 | 6/2011 | Yamaji |

FOREIGN PATENT DOCUMENTS

| JP | 3635975 B2 | 1/2005 |
| JP | 2005-123512 A | 5/2005 |
| JP | 3917211 B2 | 2/2007 |
| JP | 3941206 B2 | 4/2007 |
| JP | 2010-147181 A | 7/2010 |
| JP | 2011-096967 A | 5/2011 |

* cited by examiner

*Primary Examiner* — Nicholas Tobergte
(74) *Attorney, Agent, or Firm* — Rossi, Kimms & McDowell LLP

(57) ABSTRACT

An n well region and an n⁻region surrounding the n well region are provided in the surface layer of a p⁻silicon substrate. The n⁻region includes breakdown voltage regions in which high voltage MOSFETs are disposed. The n well region includes a logic circuit region in which a logic circuit is disposed. A p⁻ opening portion is provided between a drain region of each high voltage MOSFET and the logic circuit region. An n buffer region used as load resistances is provided between a second pick-up region and the drain region. The p⁻opening portion is provided between the n buffer region and logic circuit region. By so doing, it is possible to realize a reduction in the area of chips, and provide a high voltage semiconductor device having a level shift circuit with a high switching response speed.

15 Claims, 16 Drawing Sheets

HIGH VOLTAGE SEMICONDUCTOR DEVICE

CROSS-REFERENCE TO RELATED CASES

This application is a continuation of International Application No. PCT/JP2012/073426, filed on Sep. 13, 2012, which is based on and claims priority to Japanese Patent Application No. JP 2011-202681, filed on Sep. 16, 2011. The disclosure of the Japanese priority application and the PCT application in their entirety, including the drawings, claims, and the specification thereof, are incorporated herein by reference.

BACKGROUND

1. Field of the Invention

The present invention relates to a high voltage semiconductor device having a level shift circuit.

2. Related Art

A power device such as an IGBT (isolated gate bipolar transistor) or a power MOSFET (insulated gate field effect transistor) is utilized in many fields such as in a motor control inverter, as well as in a power source application to a PDP (plasma display panel), a liquid crystal panel, or the like, an inverter for a home electric appliance such as an air conditioner or lighting unit, and the like.

Heretofore, the drive and control of the power device has been carried out by an electronic circuit configured by combining semiconductor elements such as a photocoupler and electronic parts such as a transformer. In recent years, however, a high voltage IC of up to a 1200V level used in an AC400V-level industrial power source or the like is put into practical use owing to the advance of LSI (large scale integration) circuit technology.

As a result of this, a gate driver IC in which are incorporated a high side gate driver and low side gate driver of a power device, furthermore, a one-chip inverter IC wherein a control circuit and a power device are integrated on one semiconductor substrate, and the like, are systematized as a high voltage IC.

The high voltage IC contributes to a total reduction in size and higher efficiency of an inverter system by a reduction in the number of parts on a mounting board. FIG. 13 is a circuit diagram of a high voltage IC in which a general level shift circuit is incorporated. The circuit diagram is a diagram in which diodes 41 and 42 are added to FIG. 8 of Japanese Patent No. 3,635,975.

In FIG. 13, reference signs 17 and 18 are IGBTs (output power devices) configuring, for example, one phase of a PWM inverter. The IGBTs 17 and 18 are connected in series between a main direct current power source (positive side) Vdc with a high voltage of, for example, DC400V and a common potential COM on the negative side of the power source. An OUT terminal is the connection point of the emitter of the IGBT 17 of the upper side arm of a bridge circuit and the collector of the IGBT 18 of the lower side arm thereof. Also, the OUT terminal is the alternating current output terminal of alternating current power generated by the IGBT 17 and IGBT 18 turning on and off complementarily.

Reference sign E2 is an auxiliary direct current power source (referred to also as a driver power source) with a low voltage of, for example, 15V, the negative terminal of which is connected to the common potential COM. Also, reference sign 20 is a driver circuit which operates under the auxiliary direct current power source E2 (a power source voltage Vcc2), and the driver circuit drives the IGBT 18 of the lower side arm to turn on and off.

As other circuit portions, there are a level shift circuit and driver circuit 16 for driving the IGBT 17 of the upper side arm of the bridge circuit, and the like. Also, there are a control circuit 61 for inputting on and off signals into each of the driver circuits 16 and 20, and the like.

A high voltage MOSFET 1 is energized by an on signal 25 with a set pulse. The on signal 25 is generated by the control circuit 61 (a low potential side low voltage circuit) to which current is supplied from a low voltage power source with the negative side (common potential COM) of the main direct current power source as a reference. The high voltage MOSFET 1, being a high voltage N channel MOSFET, turns on the IGBT 17 with a voltage drop of a load resistance 3 as a signal. A high voltage MOSFET 2 is likewise energized by inputting an off signal 26 with a reset pulse generated by the control circuit 61. The high voltage MOSFET 2, being a high voltage N channel MOSFET, turns off the IGBT 17 with a voltage drop of a load resistance 4 as a signal.

Herein, the high voltage MOSFETs 1 and 2, as well as the load resistances 3 and 4, are normally configured equal to each other in order to cause the circuit constants to coincide with each other. Constant voltage diodes 5 and 6 connected in parallel to their respective load resistances 3 and 4 have the role of limiting an excessive voltage drop of the load resistances 3 and 4 and protecting NOT circuits 8 and 9 to be described hereafter. The two high voltage MOSFETs 1 and 2 of the level shift circuit form circuit portions which input signals with the common potential COM as a reference.

Meanwhile, a circuit portion bounded by the dotted line operates using as a reference a potential of the alternating current output terminal OUT alternately following the common potential COM and the potential Vdc of the high voltage main direct current power source in accordance with a turning on and off of the output IGBTs 17 and 18. Reference sign E1 in the circuit bounded by the dotted line is an auxiliary direct current power source (referred to also as a driver power source) with, for example, 15V, and a bootstrap capacitor in a bootstrap circuit is often used. The auxiliary direct current power source E1 is such that the positive terminal is connected to a positive line Vcc1, and the negative terminal is connected to the alternating current output terminal OUT.

The NOT circuits 8 and 9 and a circuit in the subsequent stage (formed of low pass filter circuits (also abbreviated as LPFs) 30 and 31, an RS flip flop (described as an RS latch or an RS-FF) 15, a driver 16, and the like) operate with the auxiliary direct current power source E1 as a power source.

However, the power source voltage of load resistance circuits of the high voltage MOSFETs 1 and 2 wherein the upper ends of the load resistances 3 and 4 are connected to the positive line Vcc1 of the auxiliary direct current power source E1 is such that the potential of the alternating current output terminal OUT varies between the common potential COM and main direct current power source (positive side) Vdc. Consequently, the power source voltage varies between E1+Vdc and E1.

Actually, however, unshown reflux diodes are connected in parallel to the IGBTs 17 and 18, respectively, with the cathodes as the collector sides. Also, there is a case in which the potential of the alternating current output terminal OUT is of a negative value of on the order of several ten V with respect to the potential of the common potential COM due to the induced electromotive force of floating inductance associated with a PCB (Printed Circuit Board) and to negative voltage noise generated by the product of circuit inductance and di/dt flowing through the IGBTs.

Next, a description will be given of an operation of the level shift circuit. Current flows through the high voltage MOSFET 1 in response to the on signal 25 applied to the gate of the high voltage MOSFET 1, and a voltage drop occurs in the load resistance 3. When the potential of the end portion of the load resistance 3 becomes equal to or smaller than the threshold value of the NOT circuit 8, the output of the NOT circuit 8 changes to Hi. This Hi level is applied to a set terminal S of the RS latch 15 via the LPF 30. Then, an output Q of the RS latch 15 changes to Hi, and the IGBT 17 is turned on via the driver 16. At the same time (to be exact, at a point slightly before an on time in order to prevent short circuit between the arms), the IGBT 18 is turned off by a signal from the control circuit 16 via an external circuit including the driver 20.

Next, by the off signal 26 being applied to the gate of the high voltage MOSFET 2, current flows through the high voltage MOSFET 2, and a voltage drop occurs in the load resistance 4. When the potential of the end portion of the load resistance 4 becomes equal to or smaller than the threshold, the output of the NOT circuit 9 changes to Hi. This Hi level is applied to a reset terminal R21 of the RS latch 15 via the LPF 31. Then, the output Q of the RS latch 15 changes to Lo, and the IGBT 17 is turned off via the driver 16. At the same time (to be exact, at a point slightly after this off time in order to prevent short circuit between the arms), the IGBT 18 is turned on via the driver 20 by a signal from the control circuit 61.

Meanwhile, when the IGBT 18 turns off, or the IGBT 17 turns on, the capacitance between the source and drain of each high voltage MOSFET 1 and 2 is charged by a sharp potential rise dV/dt occurring at the alternating current output terminal OUT as a result of this switching. A voltage drop different from with the on signal and off signal which should originally be input into the nodes of the end portions of the load resistances 3 and 4 (the nodes of the drains of the high voltage MOSFETs 1 and 2) occurs due to current charged at this time. Then, the RS latch 15 is caused to malfunction, and the IGBT 17 is erroneously turned on. As a result of this, there is fear that short circuit between the arms of the bridge circuit is caused, or the IGBT 17 is unnecessarily turned off.

There is a possibility that the same abnormal voltage drop of the load resistances 3 and 4 occurs due to exogenous noise too, apart from the switching of the IGBTs 17 and 18. The LPFs 30 and 31 are inserted in order to prevent this kind of malfunction of the RS latch 15. The LPFs 30 and 31 have the role of removing an input signal with a small pulse width (with a high frequency) based on switching or exogenous noise as an abnormal signal.

The reason to drive the IGBT 17 to turn on and off using the on signal 25 and off signal 26 which are pulse signals, as in the circuit of FIG. 13, is as follows. In order to switch an alternating current output signal of the PWM inverter or the like at high speed, it is desirable to heighten a carrier frequency which turns on and off output switching elements (the high voltage MOSFETs 1 and 2), that is, to cause the level shift circuit to operate at high speed. Also, to heighten the carrier frequency which turns on and off the output switching elements yields the advantageous effect of reducing the size of unshown coils configuring the filter circuits. As a result of this, there is an advantage that it is possible to reduce th area of the PCB, and it is possible to realize a reduction in the size of the inverter system.

Therefore, in order to cause the level shift circuit to operate at high speed, it is necessary to shorten the time for which to charge the junction capacitance of each high voltage MOSFET 1 and 2 and to reduce level shift resistance components. In order to do this, it is required to cause a relatively high current to flow through the high voltage MOSFETs 1 and 2 for the level shift circuit. However, a power loss due to the current increases particularly when the node of the OUT terminal whose potential varies due to the switching is at a high potential.

A description will be given of a case in which, for example, the voltage of the main direct current power source (positive side) Vdc is taken to be 400V, the resistance value of the level shift load resistances is taken to be 1KΩ, and the minimum on current (a drain saturation current) of the high voltage MOSFETs 1 and 2 is taken to be 50 mA. When a signal which turns on the gate of each high voltage MOSFET 1 and 2 is driven by a pulse generator circuit, and the on period duty cycle of the reset side high voltage MOSFET 2 is an average of 10%, the average loss of the high voltage MOSFET 2 is of a value of on the order of approximately 2.0 W. Although depending on the operating frequency of the IC too, in general, when mounting on an SOP (Small Outline Package) or a QFP (Quad Flat Package), the value of 2.0 W tightens particularly in terms of the standard of high temperature side allowable dissipation.

Japanese Patent No. 3,941,206 (also referred to herein as "PTL 2") discloses a high voltage IC in which are incorporated a high side gate driver of a power device and a level shift circuit. FIG. 14 is a plan view showing a main portion of a heretofore known high voltage MOSFET and high side drive circuit. FIG. 15 is a sectional view showing a sectional structure along the section line G-G' of FIG. 14. FIGS. 14 and 15 are diagrams showing only one high voltage MOSFET in FIGS. 1 and 2 of PTL 2.

In PTL 2, as shown in FIGS. 14 and 15, an opening portion 221 to which a semiconductor substrate (a p⁻substrate 200) is locally exposed is provided between an n well region 201a (the left side on the plane) forming a level shift high voltage MOSFET and an n well region 201b (the right side on the plane) forming an isolated island region (a floating potential region). A parasitic resistance R1 of an n drain region 205 of the high voltage MOSFET and the isolated island region (right side n well region 201b) is increased by providing the opening portion 221. The parasitic resistance R1 is set to a resistance value greater than that of a load resistance element (for example, a polysilicon (poly-Si) resistance $R_{L1}$) connected to the n drain region 205 and isolated island region (right side n well region 201b), and the load resistance element is used as a level shift resistance, thereby realizing a stable level shift circuit.

Only one high voltage MOSFET is described in FIG. 14. With this one-input system, the high voltage MOSFET attains an on condition for a long period, an on current continues to flow during the on period of the high voltage MOSFET, and power consumption increases.

In order to avoid this, there is proposed a two-input system wherein two high voltage MOSFETs are provided. As the two-input system is such that by transmitting an on signal and off signal in the form of pulses, it is possible to shorten the on period of the high voltage MOSFETs, and significantly reduce the power consumption of a level shifter, normally, this system is often used. A simplified HVIC is described here as corresponding to the one-input system, but it is disclosed in PTL 2 that in the two-input system too, in the same way as in the one-input system, it is possible to obtain the same advantageous effects as in the one-input system.

In FIGS. 14 and 15, reference sign 200 is the p⁻substrate, reference signs 201a and 201b are the n well regions, reference sign 202 is a p⁻offset region, reference sign 203 is an n region, reference sign 204 is a p well region, reference sign 205 is the n drain region, and reference signs 206, 215, and 216 are p⁺regions. Reference sign 210 shown in FIG. 14 is an n⁺source region, which corresponds to first and second n⁺source regions shown by reference signs 211 and 212 in FIG. 15. Reference signs 213 and 214 are n+regions, reference sign 221 is the opening portion, reference sign 231 is a gate electrode, reference sign 241 is a COM electrode, reference sign 242 is a drain electrode, reference sign 243 is a high potential electrode, reference sign 244 is a low potential electrode, and reference sign 251 is a high resistance region.

Also, Japanese Patent No. 3,917,211 (also referred to herein as "PTL 3") also discloses a high voltage IC in which are incorporated a high side gate driver of a power device and a level shift circuit. In PTL 3, a level shift high voltage MOSFET and an isolated island region (a floating potential region) are connected by a high voltage interconnect wire formed on a semiconductor substrate via an insulating film. In order to do this, the semiconductor substrate exposed between the high voltage MOSFET and isolated island region is provided as a thin slit region extending from a high potential region to a ground potential region, and the high voltage MOSFET and isolated island region are completely junction isolated from one another by the slit region.

When a high potential is applied to the interconnect wire connecting the high voltage MOSFET and isolated island region, a depletion layer extending from the high voltage MOSFET and a depletion layer extending from the isolated island region are connected together. By so doing, the potential of a region below the interconnect wire to which a surface of the substrate is exposed is raised to an intermediate potential, thereby preventing breakdown of the insulating film.

As heretofore described, in FIG. 13, when turning off the IGBT 18 and turning on the IGBT 17, a sharp potential rise and so-called dV/dt surge occur at the alternating current output terminal OUT as a result of this switching, and the potential of the alternating current output terminal OUT varies enormously. Also, the potential (Vcc1) of the positive line of the auxiliary direct current power source E1 and the drain potential of the high voltage MOSFETs 1 and 2 also vary in the same way due to the potential variation of the alternating current output terminal OUT.

Hereafter, a description will be given of a malfunction occurring due to the heretofore described variation in the voltage of the alternating current output terminal OUT and the voltage of the auxiliary direct current power source E1. Firstly, in FIG. 13, the high voltage MOSFETs 1 and 2 have parasitic output capacitances 51 and 52, each formed of a source-drain capacitance Cds and a drain-substrate capacitance Cdsub, as output capacitances having a large proportion of parasitic capacitances configured when the drain potential rises. When a dV/dt surge occurs at the alternating current output terminal OUT, an excessive current (a displacement current) responding to the dV/dt flows from the positive side of the auxiliary direct current power source E1 via the parasitic output capacitances 51 and 52, and the high voltage MOSFETs 1 and 2 attain a condition in which they are apparently turned on.

In this case, an erroneous signal is generated by the displacement current flowing through the nodes connected to the drains of the on signal side high voltage MOSFET 1 and off signal side high voltage MOSFET 2. Consideration will be given of, for example, a case in which hypothetically, the parasitic output capacitance 52 of the off signal side high voltage MOSFET 2 has varied on the order of 10% more greatly than the output capacitance 51 of the high voltage MOSFET 1 due to IC manufacturing process variation.

In this case, a voltage drop caused by the product of the displacement current resulting from the parasitic output capacitance 52×dV/dt and the load resistance 4 occurs. When the potential of the end portion of the load resistance 4 reaches the threshold value of the NOT circuit 9 or below, the node connected to the drain of the high voltage MOSFET 2 outputs a Hi level signal. The reset terminal R21 of the RS latch 15 is prioritized for the Hi level signal via the LPF 31, and the output Q of the RS latch 15 changes to Lo.

As a result of this, the IGBT 17 is turned off via the driver 16 and malfunctions. A detailed description will be given of the malfunction. Firstly, a displacement current l1 flows transiently through the on signal side, and a displacement current l2 flows transiently through the off signal side, due to variation in the voltage of the alternating current output terminal OUT, and the voltage of the auxiliary direct current power source E1, caused by the dV/dt surge.

In FIG. 13, in order to cause a surge current to flow through the common potential COM, the diode 41 and 42 are connected between the drain of the on signal high voltage MOSFET 1 and the alternating current output terminal OUT, and between the drain of the off signal high voltage MOSFET 2 and the alternating current output terminal OUT, respectively.

Herein, current components flowing by way of the diodes 41 and 42 when varying due to the dV/dt surge correspond to i1 and i2 in FIG. 13. The current components flowing by way of the load resistances 3 and 4 correspond to i1' and i2' in FIG. 13.

Displacement currents flowing through the high voltage MOSFETs 1 and 2 are represented by l1=i1+i1' and l2=i2+i2' respectively. Not only does the potential of the alternating current output terminal OUT rise due to the dV/dt surge, but the potential of the positive line Vcc1 of the auxiliary direct current power source E1 also rises with the rise in the potential of the alternating current output terminal OUT.

Because of this, immediately after the potential variation due to the dV/dt surge, the minute displacement currents i1' and i2' flow to the common potential COM via their respective load resistances 3 and 4 and high voltage MOSFETs 1 and 2. The minute displacement current i1' and a voltage drop at the load resistance 3, and the minute displacement current i2' and a voltage drop at the load resistance 4, become equal to or greater than the potential difference (herein taken to be 15V) between the positive line Vcc1 of the auxiliary direct current power source E1 and the alternating current output terminal OUT. When the voltage drop at both ends of each of the load resistances 3 and 4 is 0.6V or more lower than the potential of the alternating current output terminal OUT, the displacement currents start to flow through the diodes 41 and 42 in the forward direction. That is, with a sharp dV/dt surge of on the order of several ten KV/μs, as the voltage drop at both ends of each of the load resistances 3 and 4 is 0.6V or more lower than the potential of the alternating current output terminal OUT, most of the displacement currents flow down the diodes 41 and 42, and charge the parasitic output capacitances 51 and 52 of the high voltage MOSFETs 1 and 2. However, the minute displacement currents i1' and i2' are dominant when a dV/dt surge of on the order of several KV/μs occurs. Note that the voltage clamp constant voltage diodes 5 and 6 connected in parallel to the load resistances 3 and 4 are taken to be at an operation voltage or below.

When the displacement currents caused by the dV/dt surge of on the order of several ten KV/μs flow down the diodes 41 and 42, and charge the parasitic output capacitances 51 and 52 of the high voltage MOSFETs 1 and 2, the voltage drop at both ends of each load resistance 3 and 4 is 15.6V or more.

Because of this, both the NOT circuits 8 and 9 output Hi signals, and the RS flip flop 15 cannot distinguish between the set signal and reset signal. Because of this, the signals are not accepted, thus not resulting in a malfunction.

However, with the dV/dt surge of several KV/μs, there is a case in which the minute displacement currents i1' and i2' and the voltage drops of the load resistances 3 and 4 fall just in the vicinity of the Vth (threshold) voltage of the NOT circuits 8 and 9, and are transmitted as erroneous signals.

The Vth (threshold) voltage of the NOT circuits 8 and 9 described here is attributed to the respective current drive capabilities of an unshown NMOS and PMOS of a CMOS inverter circuit configured of the NMOS and PMOS.

Assuming that the current drive capabilities of the NMOS and PMOS are equal, the Vth voltage of the NOT circuits 8 and 9 is represented by the potential difference between the positive line Vcc1 of the auxiliary direct current power source E1 and the alternating current output terminal OUT÷2=7.5 (V). Herein, a description will be given of erroneous signals triggered by the displacement currents i1' and i2' when the on signal side and off signal side parasitic output capacitances 51 and 52 components are different from one another due to manufacturing variation, as heretofore described.

When the dV/dt surge of several KV/µs enters the alternating current output terminal OUT, one of the minute displacement currents i1' and i2' between the positive line Vcc1 of the auxiliary direct current power source E1 and the alternating current output terminal OUT exceeds 1.5 mA (the threshold voltage 7.5V of the NOT circuits 8 and 9÷ the load resistances 5.0KΩ).

As the Hi signal is then input into one of the NOT circuits 8 and 9, an erroneous signal is transmitted to the output Q of the RS latch 15. An estimation of on signal side and off signal side voltage drops of the erroneous signal at this time is such that, for example, when a combined capacitance Cn1 of the output capacitance 51 (Cds+Cdsub) of the high voltage MOSFET 1 is taken to be 2 pF, a combined capacitance Cn2 of the output capacitance 52 (Cds+Cdsub) of the high voltage MOSFET 2 is taken to be 2.2 pF (assuming that there is an increase of 10% due to manufacturing variation), and the load resistances 3 and 4 are taken to be 5.0KΩ, a dV/dt surge of 0.7 KV/µs enters the alternating current output terminal OUT. At this time, a voltage drop of the node connected to the on signal side (i1' side) load resistance 3 is represented by the following expression (I').

$$Vs1 = 2 \times 10^{-12} \times (0.7 \times 10^3/(1 \times 10^{-6})) \times 5 \times 10^3 = 7.0V \quad (I')$$

Meanwhile, a voltage drop of the node connected to the off signal side (i2' side) load resistance 4 is represented by the following expression (II').

$$Vr1 = 2.2 \times 10^{-12} \times (0.7 \times 10^3/(1 \times 10^{-6})) \times 5 \times 10^3 = 7.7V \quad (II')$$

At this time, as the voltage drop of the node connected to the off signal side load resistance 4 exceeds the threshold voltage Vth=7.5V of the NOT circuit 9, only the NOT circuit 9 erroneously outputs the Hi signal.

In order to mitigate the heretofore described erroneous signal level, it is conceivable to, for example, reduce the resistance values of the level shift load resistances 3 and 4 from 5KΩ to on the order of 1KΩ, but there is the following kind of problem. Firstly, when the on currents of the high voltage MOSFETs 1 and 2 when the load resistances 5KΩ are used are hypothetically set to a saturation current of 10 mA, it is necessary, with a load resistance of 1KΩ, to cause a saturation current of 50 mA to flow.

When the saturation current of 50 mA of the high voltage MOSFETs 1 and 2 is caused to flow, the voltage of the main direct current power source Vdc is taken to be 400V, and signals which turn on the gates of the high voltage MOSFETs 1 and 2 are hypothetically driven by a pulse generator. In this case, in particular, when the on duty cycle of the reset side high voltage MOSFET 2 is taken to be an average of 10%, a switching is performed in a condition in which the emitter potential of the IGBT 17 is high. Because of this, the average loss of he high voltage MOSFET 2 is as much as on the order to 2.0 W, thus significantly exceeding the allowable dissipation of a package for sealing the high voltage IC with resin.

Normally, the heat allowable dissipation of an SOP (Small Outline Package) with enhanced heat dissipation is on the order of 0.8 W. Because of this, in order to reduce the heat allowable dissipation to 0.8 W or below, it is necessary to shorten the on duty of the high voltage MOSFETs 1 and 2 to 4% or below.

However, when the on duty of the high voltage MOSFETs 1 and 2 is shortened, a high switching frequency of several hundred KHz to several MHz is required for a reduction in the size of a power source system in the application to power supply equipment with low and medium capacitance, an FPD (Flat Panel Display), a household electrical appliance, or the like.

At this time, the relationship with a delay time resulting from the input capacitance and output capacitance of the level shift circuit and the input capacitance of the subsequent stage, such as the buffer circuit (the NOT circuits 8 and 9, the LPFs 30 and 31, and the like) and the driver 16, can be a problem.

In the case of the kind of high voltage IC shown in FIG. 13 in which are incorporated the general level shift circuit and floating potential region, a turn-on/off transmission delay time from the load resistance circuit to the driver 16 is on the order of 100 ns to 200 ns.

This is due to the effect of the charging time of the parasitic output capacitances 51 and 52, the parasitic capacitance of the buffer circuit, or the like. That is, when the oscillation frequency of the high voltage IC is set to 1 MHz, a 10% duty falls in an on period of 100 ns, meaning that there occurs the constraint that it is not possible to set the duty to an on duty equal to or lower than the 10% duty or an off duty equal to or higher than 90%.

Because of this, even though the on and off duties of the high voltage MOSFETs 1 and 2 are driven at 4% or below in order to reduce the average loss, the problem of no on signal being transmitted occurs depending on the transmission delay time.

The signal level of an erroneous signal generated by the displacement current resulting from the dV/dt surge depends heavily on the capacitance values of the parasitic output capacitances 51 and 52 of the high voltage MOSFETs 1 and 2 described in FIG. 13, and is less affected by the NOT circuits 8 and 9 and LPFs 30 and 31, and apart from them, by a floating capacitance below a metal wiring, and the like.

Also, apart from the heretofore described malfunction mode, when the dV/dt surge is input, the period of charging the parasitic output capacitances 51 and 52 of the on signal side high voltage MOSFET 1 and off signal side high voltage MOSFET 2 is a period for which a transmission signal is not transmitted to the next stage. There is also the problem that the input/output transmission delay time of the high side drive circuit increases in a period for which this input signal and the dV/dt surge are superimposed on each other.

Therefore, it is very effective to suppress the allowable dissipation of the high voltage IC while lowering the output capacitances of the high voltage MOSFETs 1 and 2 in order to lower the displacement current which causes a malfunction and increase in transmission delay time based on the dV/vt surge.

As shown in FIGS. 14 and 15, in the heretofore described PTL 2, the drain region of the high voltage MOSFET and the high voltage isolated island region are integrated. Also, it is described that the opening portion 221 to which is exposed the p$^-$substrate 200 is provided between the drain region 205 of the high voltage MOSFET and the high side drive circuit logic region and n⁺region 214 (a second pick-up region 122 in FIG. 16 to be described hereafter) which is at a potential of Vcc1. With the heretofore described PTL 2, it is possible to heighten the parasitic resistance between the drain region 205 of the high voltage MOSFET and the n⁺region 214 (second pick-up region 122), but the following problems arise.

FIG. 16 is a plan view showing parasitic output capacitance components of high voltage MOSFETs of a heretofore known example. As shown in FIG. 16, an output capacitance Coss (a junction capacitance C1) of each high voltage MOSFET 71 and 72 is formed between the n⁺drain region 213 and ground potential region (a p⁻well region 102) of each corresponding high voltage MOSFET 71 and 72. Further, parasitic junction capacitances C2 formed in parallel with the junction capacitance C1 exist in a breakdown voltage region 80 (HVJT; a high voltage junction terminal region) and a high side n well region 201. By so doing, a net output capacitance Ctotal of the high voltage MOSFET 71 is presented by Ctotal=C1+(2× C2), meaning that there is the problem that the output capacitance Coss of each high voltage MOSFET 71 and 72 becomes very high.

In FIG. 16, reference sign 15 is an RS flip flop (RS-FF, RS latch), reference sign 16 is a high side driver portion, reference sign 16a is a high side logic circuit portion, reference signs 30 and 31 are the low pass filter circuits (LPFs), and reference signs 71 and 72 are the high voltage MOSFETs. Also, reference sign 101 is an n⁻region, reference sign 102 is the p⁻well region, reference sign 103 is an n⁺drain region, reference sign 104 is an n buffer region, reference sign 105 is a p base region, reference sign 113 is a p⁺region, reference sign 114 is an n⁺source region, reference sign 115 is a gate electrode, reference sign 120 is a drain electrode, reference sign 122 is a second pick-up region (an n⁺region), reference sign 131 is a p⁻opening portion, and reference sign 201 is the n well region.

Also, in the heretofore described PTL 3, it is described that the breakdown voltage structure of the level shift high voltage MOSFET in the high voltage IC and the breakdown voltage structure of the high voltage isolated island region are brought together. However, in the heretofore described PTL 3, a slit region, to which is exposed the semiconductor substrate, divided perpendicularly to equipotential lines from the high potential region to the ground potential region is provided between the high voltage MOSFET and isolated island region. Because of this, the potential gradient is difficult to uniformize in the slit region inside the breakdown voltage structure, and the growth of a depletion layer is suppressed, due to which there is the problem that it is easy to locally cause electric field concentration, and it is difficult to raise a breakdown voltage. Also, the heretofore described PTL 3 does not describe the output capacitance of the high voltage MOSFET either.

Also, in order to configure the heretofore described level shift circuit of the high voltage IC, it is essential to form level shift resistances, but in the heretofore described PTLs 2 and 3, resistance elements of polysilicon are disposed in the high side drive circuit region as the level shift resistances. Because of this, it is necessary to secure load resistance formation regions corresponding to two input signals, a set signal and a reset signal. There is more than a little increase in the chip area of the high voltage IC due to this, and an increase in the number of manufacturing steps by adding a high resistance polysilicon formation step is also unavoidable.

Meanwhile, a description will be given of a case in which the resistance elements of polysilicon or the like are not used as the level shift resistances. FIG. 17 is a plan view showing another example of the main portion of the high voltage MOSFETs and high side drive circuit of the heretofore known example. When the resistance elements of polysilicon or the like are not used as the level shift resistances, it is conceivable that a parasitic resistance region of an N-type diffusion layer or N-type epitaxial layer positioned between the drains of the high voltage MOSFETs and a high potential side (the positive line of the auxiliary direct current power source E1) Vcc1 pick-up region of the high side drive circuit is used as the level shift resistances, as shown in FIG. 17.

In the two-input method, in order to prevent a malfunction due to the dV/dt surge or the like, it is ideal that the output capacitances of the set side and reset side level shift resistances and high voltage MOSFETs are equal to each other without any variation.

However, when the parasitic resistance region of the N-type diffusion layer or N-type epitaxial layer positioned between the drains of the high voltage MOSFETs and the high potential side Vcc1 pick-up region of the high side drive circuit is used as the level shift resistances, as shown in FIG. 17, the parasitic resistance varies according to a position in which is disposed the high potential side Vcc1 pick-up region of the high side drive circuit, and the absolute value of the level shift resistances changes depending on a layout.

Because of this, in the two-input method, when the set side and reset side level shift resistances vary, a difference occurs between the potential changes of the drain nodes of the set side and reset side high voltage MOSFETs when the dV/dt surge is input into the level shift circuit, and there is a possibility that an erroneous signal is transmitted to the logic circuit in the subsequent stage.

Also, the N-type diffusion layer or N-type epitaxial layer between the drains of the high voltage MOSFETs and the high potential side Vcc1 pick-up region of the high side drive circuit forms a variable resistance region which varies according to the potential condition (herein, a change from 15V to 415 v which is higher by a Vdc voltage) of the positive line Vcc1 of the auxiliary direct current power source E1.

In a condition in which the potential of the positive line Vcc1 of the auxiliary direct current power source E1 is as high as 415V, the parasitic resistance value increases due to depletion from the junction portion of the parasitic resistance region and ground potential region, and the input/output transmission delay time increases. The higher the potential dependence of the resistance value of the parasitic resistance region, the higher the U-VCC voltage dependence of the input/output transmission delay time, as a result of which the frequency of the high voltage IC cannot be made higher.

SUMMARY OF INVENTION

The invention, in order to solve the heretofore described problems of the heretofore known technologies, has an object of providing a high voltage semiconductor device including a level shift circuit wherein a reduction in the area of chips is realized, a circuit malfunction and increase in transmission delay time accompanied by a power loss and dV/dt surge when switching are suppressed, and a switching response speed is high.

In order to solve the heretofore described problems and achieve the object of the invention, a high voltage semiconductor device according to the invention has the following characteristics. A second conductivity type semiconductor region is provided on a first conductivity type semiconductor substrate. A logic circuit is provided in the surface layer of the semiconductor region. An insulated gate field effect transistor is provided in the semiconductor region. The insulated gate field effect transistor has a second conductivity type source region provided on the outer peripheral side of the semiconductor region, a gate electrode provided on the semiconductor region via an insulating film, and a second conductivity type drain region provided in the surface layer of the semiconductor region so as to be spaced a predetermined distance from the outer peripheral edge of the semiconductor region. A second conductivity type pick-up region is provided in the surface layer of the semiconductor region, away from the drain region, so as to be spaced the predetermined distance from the outer peripheral edge of the semiconductor region. A first conductivity type opening portion reaching the semiconductor substrate from the surface of the semiconductor region is provided away from the drain region, second conductivity type pick-up region, and logic circuit, between the logic circuit and a region from the drain region to a portion of the semiconductor region extending to one drain region side portion of the second conductivity type pick-up region via a portion of the semiconductor region sandwiched between the drain region and second conductivity type pick-up region. A load resistance formed of a portion of the semiconductor region sandwiched between the drain region and second conductivity type pick-up region is provided.

Also, the high voltage semiconductor device of the invention according to the heretofore described invention is such that it is preferable that the load resistance is a second conductivity type buffer region, higher in impurity concentration than the semiconductor region, provided in a portion of the semiconductor region sandwiched between the drain region and second conductivity type pick-up region so as to make contact with the drain region and second conductivity type pick-up region.

Also, the high voltage semiconductor device of the invention according to the heretofore described invention is further such that a first conductivity type base region is annularly provided in the outer peripheral side surface layer of the semiconductor region. A first conductivity type pick-up region is provided inside the base region. Further, the source region is provided inside the base region.

Also, the high voltage semiconductor device of the invention according to the heretofore described invention is such that the opening portion may be a region wherein the semiconductor substrate is exposed to a surface of the semiconductor region on the side opposite from the semiconductor substrate side. Also, the high voltage semiconductor device of the invention according to the heretofore described invention is such that it is preferable that the opening portion is a first conductivity type diffusion region, higher in impurity concentration than the semiconductor substrate, selectively formed in the surface layer of the semiconductor substrate.

Also, the high voltage semiconductor device of the invention according to the heretofore described invention is such that it is preferable that the opening portion has a trench formed in the depth direction of the semiconductor substrate from the surface of the semiconductor substrate and an insulating body buried in the trench.

Also, the high voltage semiconductor device of the invention according to the heretofore described invention is such that a configuration may be adopted wherein depletion layers extending from the pn junctions into the opening portion make contact with each other before avalanche breakdown occurs in the pn junction of the opening portion and semiconductor region and the pn junction of the semiconductor region and semiconductor substrate.

Also, the high voltage semiconductor device of the invention according to the heretofore described invention is such that it is preferable that the semiconductor region is a second conductivity type epitaxial growth layer formed on the semiconductor substrate.

Also, the high voltage semiconductor device of the invention according to the heretofore described invention is such that a configuration is adopted wherein the semiconductor region is formed of a first region in which is provided the logic circuit and a second region surrounding the first region, and the first region is formed of a first diffusion region, while the second region is formed of a second diffusion region lower in impurity concentration than the first diffusion region.

Also, the high voltage semiconductor device of the invention according to the heretofore described invention is such that it is preferable that a first conductivity type offset region is provided inside the semiconductor region so as to surround the logic circuit.

Also, the high voltage semiconductor device of the invention according to the heretofore described invention is such that it is preferable that a first conductivity type offset region is provided inside the semiconductor region so as to surround the logic circuit, and the offset region is in contact with the base region or opening portion or with two of them.

Also, in order to solve the heretofore described problems and achieve the object of the invention, a high voltage semiconductor device according to the invention, which drives a switching element of which the high potential side terminal is connected to a high voltage power source and the low potential side terminal is connected to an OUT terminal which can take the potential between the high potential and ground potential of the high voltage power source, has the following characteristics. It is preferable that a second conductivity type semiconductor region is provided on a first conductivity type semiconductor substrate. A logic circuit using as a power source a low potential power source with the OUT terminal as a reference is provided in the semiconductor region. Also, an insulated gate field effect transistor is disposed in the semiconductor region. The insulated gate field effect transistor has a first conductivity type base region annularly provided on the outer peripheral side of the semiconductor region, a second conductivity type source region provided inside the base region, a gate electrode provided on the semiconductor region via an insulating film, and a second conductivity type drain region provided in the surface layer of the semiconductor region so as to be spaced a predetermined distance from the base region. A second conductivity type pick-up region connected on the high potential side of the low potential power source with the OUT terminal as the reference is provided in the surface layer of the semiconductor region rather than the drain region, away from the drain region, so as to be spaced a predetermined distance from the base region. A first conductivity type pick-up region connected to the ground of a low potential power source with the ground as a reference is provided inside the base region. A region in which the first conductivity type pick-up region is not formed, and parasitic resistance component Rp are provided, is provided in a region of the source region close to an end portion in the channel width direction of the insulated gate field effect transistor.

Also, the high voltage semiconductor device of the invention according to the heretofore described invention is such that it is preferable to adopt a configuration wherein when a junction capacitance existing between the drain region and source region is taken to be C1, a junction capacitance component existing in parallel with the junction capacitance C1 in the channel width direction of the insulated gate field effect transistor is taken to be Cn (F), a parasitic resistance component in a portion of the semiconductor region adjacent to a portion of the semiconductor region sandwiched between the drain region and source region is taken to be Rn (Ω), the parasitic resistance component is taken to be Rp (Ω), and the reciprocal number of a rise time when the insulated gate field effect transistor turns on, the reciprocal number of a fall time when the insulated gate field effect transistor turns off, or the reciprocal number of a period for which a dV/dt surge input into the OUT terminal is being generated, is taken to be fc (Hz), $Rp \geq \{1/(2\pi \times Cn \times fc)\} - Rn$ is satisfied.

Also, the high voltage semiconductor device of the invention according to the heretofore described invention is such that the junction capacitance C1 exists in a portion of the semiconductor region between a drift region sandwiched between the drain region and source region and the first conductivity type pick-up region. The junction capacitance components Cn exist in parallel with the junction capacitance C1 via a portion of the semiconductor region adjacent to the drift region. The parasitic resistance components Rn, being portions of the semiconductor region other than the drift region, are formed between the drain region and the pn junction of the base region in the region in which the first conductivity type pick-up region is not formed and the semiconductor region. The parasitic resistance components Rp are formed in a portion of the semiconductor region between the base region in the region in which the first conductivity type pick-up region is not formed and the first conductivity type pick-up region.

According to the high voltage semiconductor device of the invention, there is yielded the advantageous effect of being able to provide a high voltage semiconductor device including a level shift circuit wherein an opening portion is formed between a drain region of an insulated gate field effect transistor and a logic circuit region (a first region), and a semiconductor region or buffer region between a second conductivity type pick-up region and the drain region is used as a load resistance, thereby realizing a reduction in the area of chips, and suppressing a circuit malfunction and increase in transmission delay time accompanied by a power loss and dV/dt surge when switching, and a switching response speed is high.

DETAILED DESCRIPTION

Figure 1:
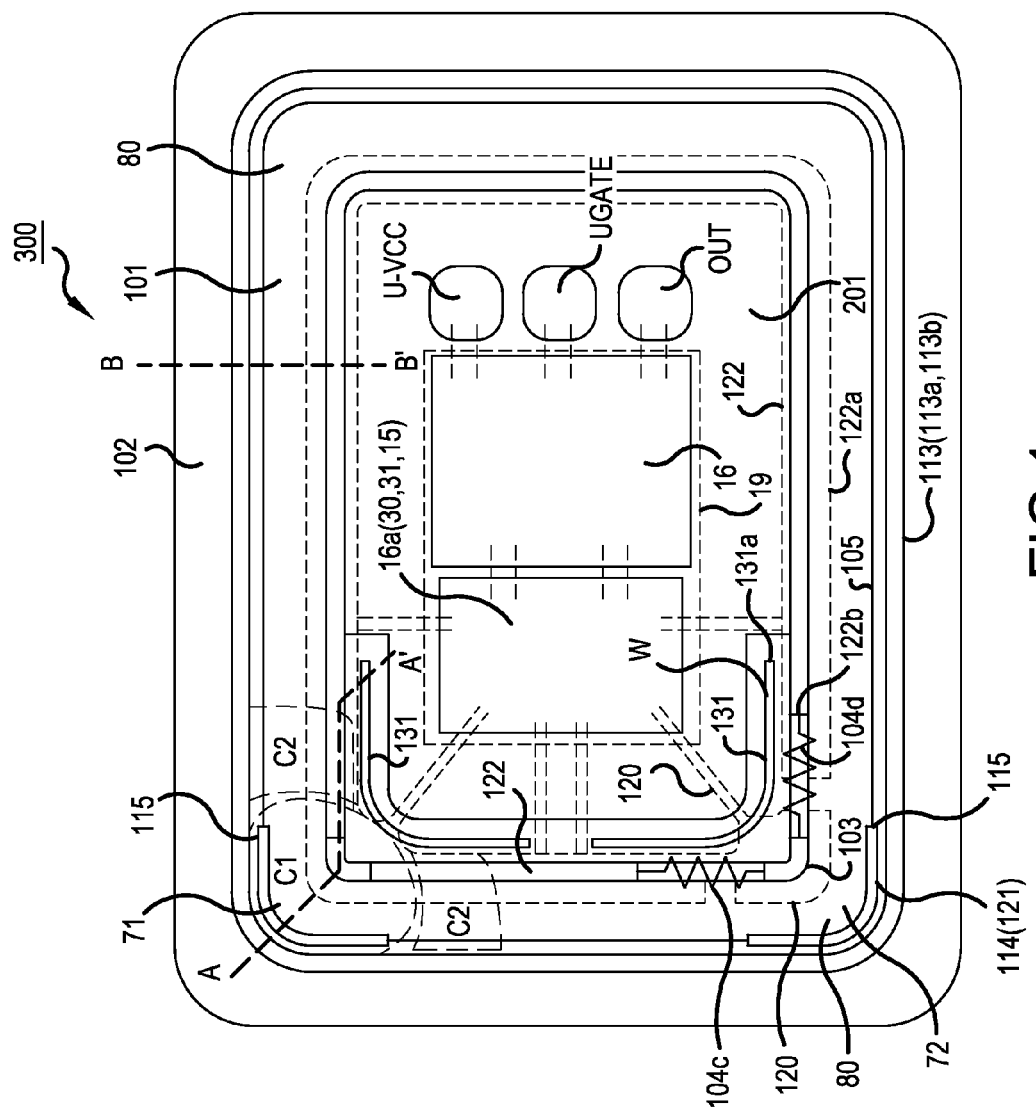
FIG. 1 is a plan view showing a main portion of a high voltage semiconductor device according to Embodiment 1 of the invention.

Hereafter, a detailed description will be given, referring to the accompanying drawings, of preferred embodiments of a high voltage semiconductor device according to the invention. In the present specification and accompanying drawings, n and p mean that electrons or holes are majority carriers in layers or regions prefixed with n or p. Also, + and − superscribed after n or p respectively mean a higher impurity concentration and lower impurity concentration than in layers or regions without either + or −. In the description of the following embodiments and the accompanying drawings, the same reference signs will be given to the same configurations, and a redundant description will be omitted.

Also, it should be noted that high voltage semiconductor devices described in the accompanying drawings are schematic, and the relationship between the thickness and plane dimensions of each layer, the thickness ratio of each layer, and the like, are different from the actual ones. Consequently, specific thicknesses and dimensions should be judged by making allowance for the following description. Also, it is a matter of course that portions different in dimensional relationship or ratio from one drawing to another are also included in the drawings.

Also, in the following embodiments, a description is given using a silicon (Si) substrate as a semiconductor substrate, but it is possible to obtain the same advantageous effects even by using a semiconductor substrate of other than silicon, such as of silicon carbide (SiC) or gallium nitride (GaN).

Figure 11:
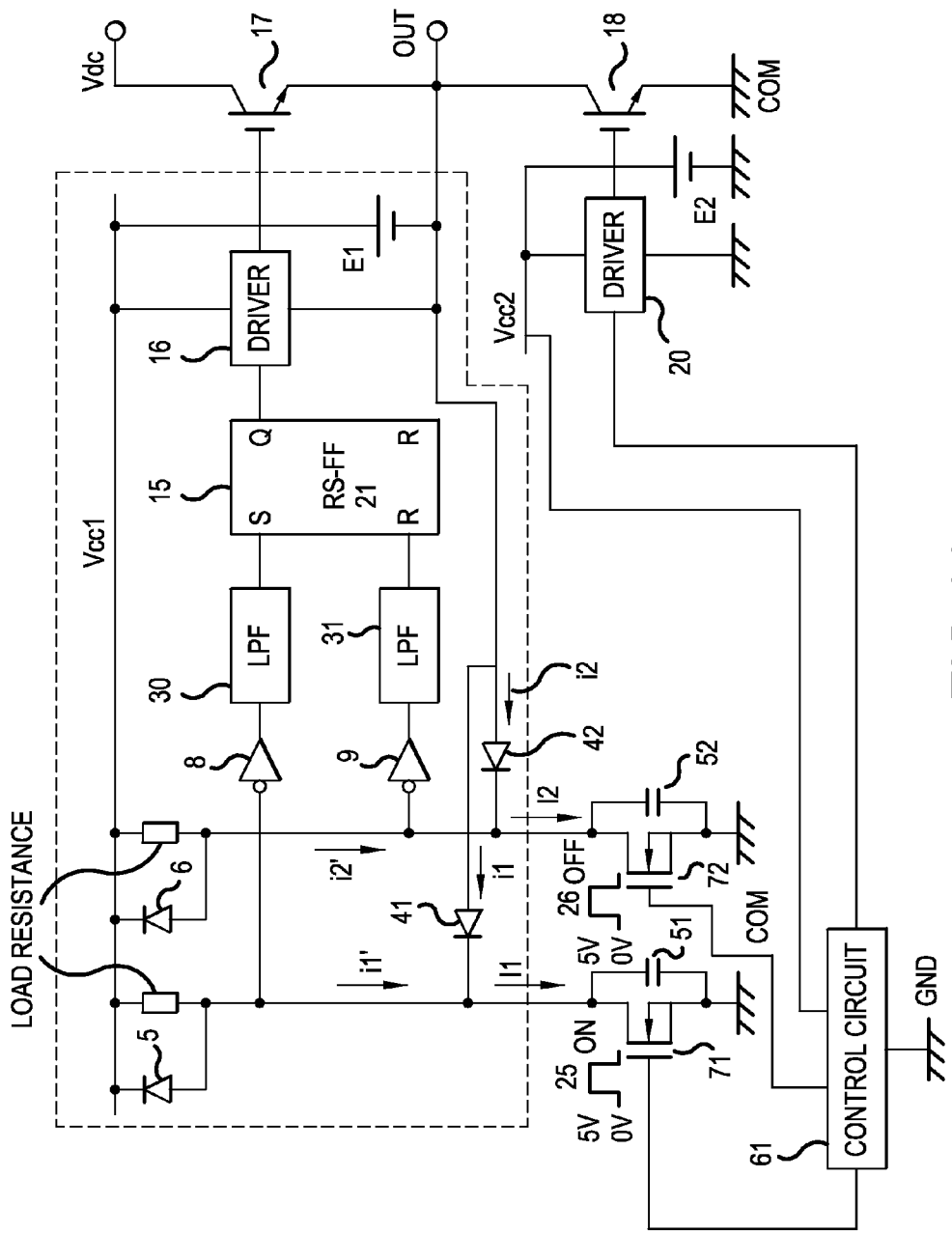
FIG. 11 is a circuit diagram showing a main portion of a high voltage semiconductor device in which is incorporated the level shift circuit according to the invention.
Figure 13:
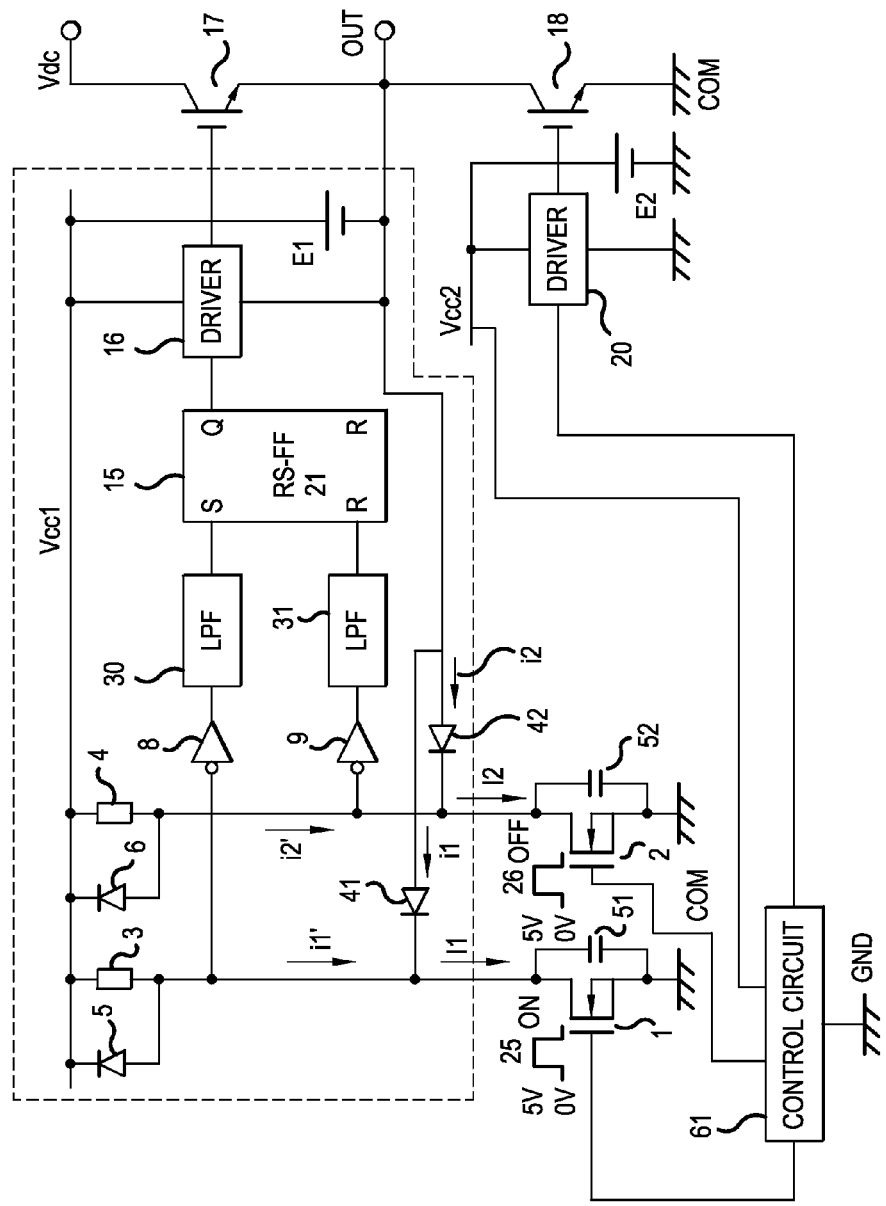
FIG. 13 is a circuit diagram of a high voltage IC in which is incorporated a general level shift circuit.

FIG. 11 is a circuit diagram showing a main portion of a high voltage semiconductor device in which is incorporated a level shift circuit according to the invention. As the high voltage semiconductor device in which is incorporated the level shift circuit shown in FIG. 11 is the same as a high voltage IC in which is incorporated a general level shift circuit shown in FIG. 13, except the structures of high voltage MOSFETs 71 and 72, a description is omitted.

High voltage semiconductor devices 300, 400, 500, 600, and 700 shown in FIGS. 1, 3, 7, 9, and 12, to be described hereafter in Embodiments 1 to 5, correspond to the region bounded by the dotted line, and to the high voltage MOSFETs 71 and 72, in the circuit diagram of the high voltage IC in which is incorporated the level shift circuit shown in FIG. 11. Load resistances in FIGS. 11 (104c and 104d in FIG. 1, and 104a and 104b in FIGS. 3, 7, and 9) correspond to load resistances 3 and 4 in FIG. 13. A description of diodes 5 and 6 connected one across each respective load resistance, a diode 41 which causes a displacement current l1 to flow, and a diode 42 which causes a displacement current l2 to flow, in FIG. 11, is omitted in FIGS. 1 and 3.

(Embodiment 1)

A description will be given of a structure of a high voltage semiconductor device according to Embodiment 1. FIG. 1 is a plan view showing a main portion of the high voltage semiconductor device 300 according to Embodiment 1 of the invention. The high voltage semiconductor device 300 according to Embodiment 1 of the invention shown in FIG. 1 is a high voltage IC wherein a level shift circuit portion including high voltage MOSFETs 71 and 72 and a drive circuit including a floating potential region are formed on one semiconductor substrate.

Figure 2A:
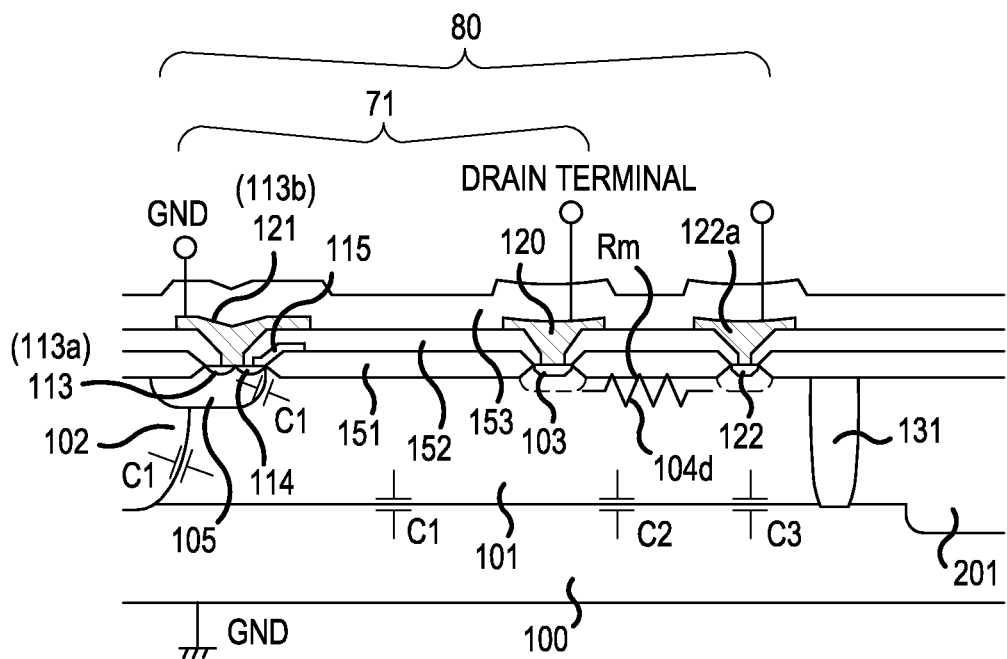
FIGS. 2(a) and 2(b) are sectional views showing a main portion of the high voltage semiconductor device according to Embodiment 1 of the invention.
Figure 2B:
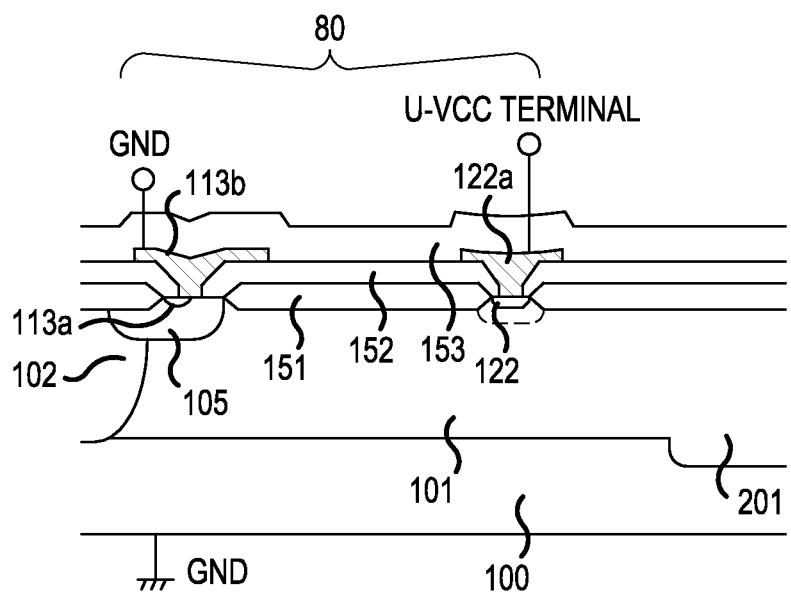

FIGS. 2(a) and 2(b) are sectional views showing a main portion of the high voltage semiconductor device 300 according to Embodiment 1 of the invention. FIG. 2(a) is a main portion sectional view showing a sectional structure along the section line A-A' of FIG. 1, while FIG. 2(b) is a main portion sectional view showing a sectional structure along the section line B-B' of FIG. 1.

The high voltage semiconductor device 300 shown in FIGS. 1 and 2 includes the high voltage MOSFETs 71 and 72 (corresponding to reference signs 71 and 72 in FIG. 11) configuring the level shift circuit, load resistances 104c and 104d (corresponding to reference signs 3 and 4 in FIG. 13), a high side logic circuit portion 16a, a high side driver portion 16, and the like. The high side logic circuit portion (logic circuit portion) 16a, configured of an RS flip flop 15 (RS-FF, RS latch), low pass filter circuits (LPFs) 30 and 31, and NOT circuits (inverter circuits) 8 and 9, shown in FIG. 11, receives signals (the drain voltages of the high voltage MOSFETs 71 and 72) from the level shift circuit, and outputs the signals to the high side driver portion 16 (drivers 16 and 20 in FIG. 11). Also, the high side driver portion 16 is a circuit which outputs a gate signal to an IGBT 17, shown in FIG. 11, which configures a main circuit.

The high voltage semiconductor device 300 includes an annular n⁻ region 101 provided on a p⁻ silicon substrate 100 and the high voltage MOSFETs 71 and 72 each disposed in the surface layer of one portion of the n⁻ region 101. Each of the high voltage MOSFETs 71 and 72 includes an n⁺ drain region 103 provided in the surface layer of the n⁻ region 101. The n⁺ drain region 103 is selectively provided in the surface layer (a surface layer on the side opposite from the p⁻ silicon substrate 100 side) of the n⁻ region 101.

Also, a p base region 105 is provided in the surface layer of the n⁻ region 101, away from the n⁺ drain region 103 and in contact with the n⁻ region 101, so as to surround the n⁻ region 101. A p⁺ region 113 and an n⁺ source region 114 are selectively provided inside the p base region 105.

A source electrode 121 is connected to the n⁺ source region 114. The source electrode 121 is also connected to the p⁺ region 113 (a first pick-up region 113a), and functions as a first pick-up electrode 113b to which a low potential is applied. A drain electrode 120 to which is applied a high potential, rather than the low potential which is applied to the first pick-up electrode 113b, is connected to the n⁺ drain region 103. An n well region 201 surrounded by the n⁻ region 101 and a p⁻ well region (a ground potential region) 102 which surrounds the n⁻ region 101 are further provided on the p⁻ silicon substrate 100.

A logic circuit region 19 (the high side logic circuit portion 16a and high side driver portion 16) is disposed in the n well region 201. A p⁻ opening portion 131 is selectively disposed, away from the n⁺ drain region 103 and logic circuit region 19, between the n⁺ drain region 103 and logic circuit region 19.

The p⁻ opening portion 131, being a p⁻ region penetrating through the n⁻ region 101 and reaching the p⁻ silicon substrate 100, is exposed to a surface (a surface on the side opposite from the p⁻ silicon substrate 100 side) of the n⁻ region 101. The p⁻ opening portion 131 is a p-type diffusion region formed by diffusing p-type impurities into the p⁻ silicon substrate 100.

Also, a region of the n⁻ region 101 between the n⁺ drain region 103 and p base region 105 forms a drift region of each high voltage MOSFET. A gate electrode 115 is provided, via an insulating film, on the surface of a portion of the p base region 105 sandwiched between the n⁻ region 101 and n⁺ source region 114. An n-type second pick-up region 122 is provided inside the n⁻ region 101. The second pick-up region 122 is disposed away from the n⁺ drain region 103.

The p⁻ opening portion 131 is selectively disposed opposite and parallel to the second pick-up region 122 and n⁺ drain region 103. Also, the p⁻ opening portion 131 is disposed so that an end portion 122b of the second pick-up region 122 enters the n⁺ drain region 103 side of an end portion 131a of the p⁻ opening portion 131. That is, the p⁻ opening portion 131 is disposed so as to be positioned between the n⁺ drain region 103 side end portion 122b of the second pick-up region 122 and the logic circuit region 19.

A portion of the n⁻ region 101 sandwiched between the p⁻ opening portion 131 and first pick-up region 113a and a portion of the n⁻ region 101 sandwiched between the n⁺ drain region 103 and second pick-up region 122 can be used as the load resistances 104c and 104d.

Also, a width W of the p⁻ opening portion 131 is set so that depletion layers extending from the pn junction of the p⁻ opening portion 131 and n⁻ region 101 into the p⁻ opening portion 131 make contact with each other before avalanche breakdown occurs in the pn junction of the p⁻ opening portion 131 and n⁻ region 101 and the pn junction of the n⁻ region 101 and p⁻ silicon substrate 100 when a low potential is applied to the source electrode 121 and first pick-up electrode 113b, and a high potential is applied to the drain electrode 120 and a second pick-up electrode 122a.

Figure 14:
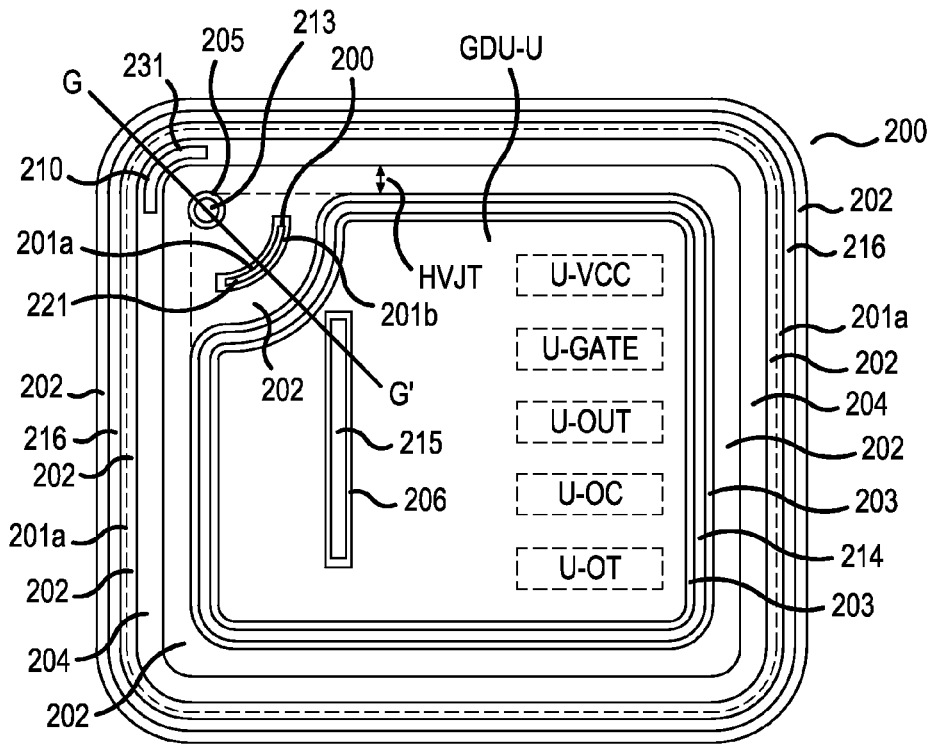
FIG. 14 is a plan view showing a main portion of a high voltage MOSFET and high side drive circuit of a heretofore known example.

Also, the p⁻ opening portion 131 may have a configuration wherein the p⁻ silicon substrate 100 is exposed to the n⁻ region 101 surface (a surface on the side opposite from the p⁻ silicon substrate 100 side), as with an opening portion 221 shown in FIG. 14. Also, although not shown, the p⁻ opening portion 131 may be configured of a trench formed so as to penetrate through the n⁻ region 101 from the surface of the p⁻ silicon substrate 100 and reach the p⁻ silicon substrate 100, and an insulating body buried in the trench. In this case, the depth of the insulating body buried in the trench is made equal to or greater than a depth such that no breakdown occurs in the insulating body.

Also, as shown in FIG. 2, an n-type impurity region lower in impurity concentration than the n⁺ drain region 103 may be provided between the n⁺ drain region 103 and n⁻ region 101 so as to enclose the n⁺ drain region 103 (the portion shown by the dotted line bounding the n⁺ drain region 103). Also, an n-type impurity region lower in impurity concentration than the second pick-up region 122 may be provided between the second pick-up region 122 and n⁻ region 101 so as to enclose the second pick-up region 122 (the portion shown by the dotted line bounding the second pick-up region 122). By forming the n-type impurity regions relatively lower in impurity concentration than the n+drain region 103 and second pick-up region 122, it is possible to alleviate an electric field in the vicinity of the n+drain region 103 or second pick-up region 122 when a high voltage is applied. Because of this, it is possible to achieve a higher breakdown voltage and improve the on breakdown voltage of the high voltage MOSFETs 71 and 72. When there is an impurity concentration difference between the n+drain region 103 and n−region 101, or between the second pick-up region 122 and n−region 101, the potential distribution in a portion with the impurity concentration difference is dense, meaning that it is desirable to form the n-type impurity region relatively lower in impurity concentration than the n+drain region 103 as a buffer layer, as shown by the dotted line.

There are such advantageous effects as shown in the following (1) to (3) by using the portions of the n−region 101 sandwiched between the p−opening portion 131 and p+region 113 (first pick-up region 113a), and between the n+drain region 103 and second pick-up region 122, as the load resistances 104c and 104d (level shift resistances).

(1) There is no more need to provide regions in which to form the load resistances 104c and 104d (regions in which to form load resistor elements) in the n well region 201 (a region in which to form the high side logic circuit portion 16a).

(2) It is possible to optionally set the resistance values of the load resistances 104c and 104d with high accuracy and less variation simply by using the distance between the second pick-up electrode 122a and drain electrode 120 as a parameter. The load resistances 104c and 104d are higher than the load resistances 104a and 104b of the high voltage semiconductor device according to Embodiment 2 shown in FIGS. 3 and 4, to be described hereafter.

(3) It is possible to lower parasitic junction capacitance components C2 of each high voltage MOSFET 71 and 72 (C2 decreases in size).

Also, when a low potential is applied to the source electrode 121 and first pick-up electrode 113b, and a high potential is applied to the drain electrode 120 and second pick-up electrode 122a, depletion layers extend from the pn junction of the p base region 105 and n−region 101 and the pn junction of the p−well region 102 and n−region 101. A breakdown voltage is secured by extending the depletion layers in this way. The structure of securing the breakdown voltage in this way is referred to as a high voltage junction terminal structure (HVJT). In the invention, the n−region 101 from the p−well region 102 to the n+drain region 103 and the n−region 101 from the p−well region 102 to the second pick-up region 122 are made to be a breakdown voltage region 80.

(Embodiment 2)

Figure 3:
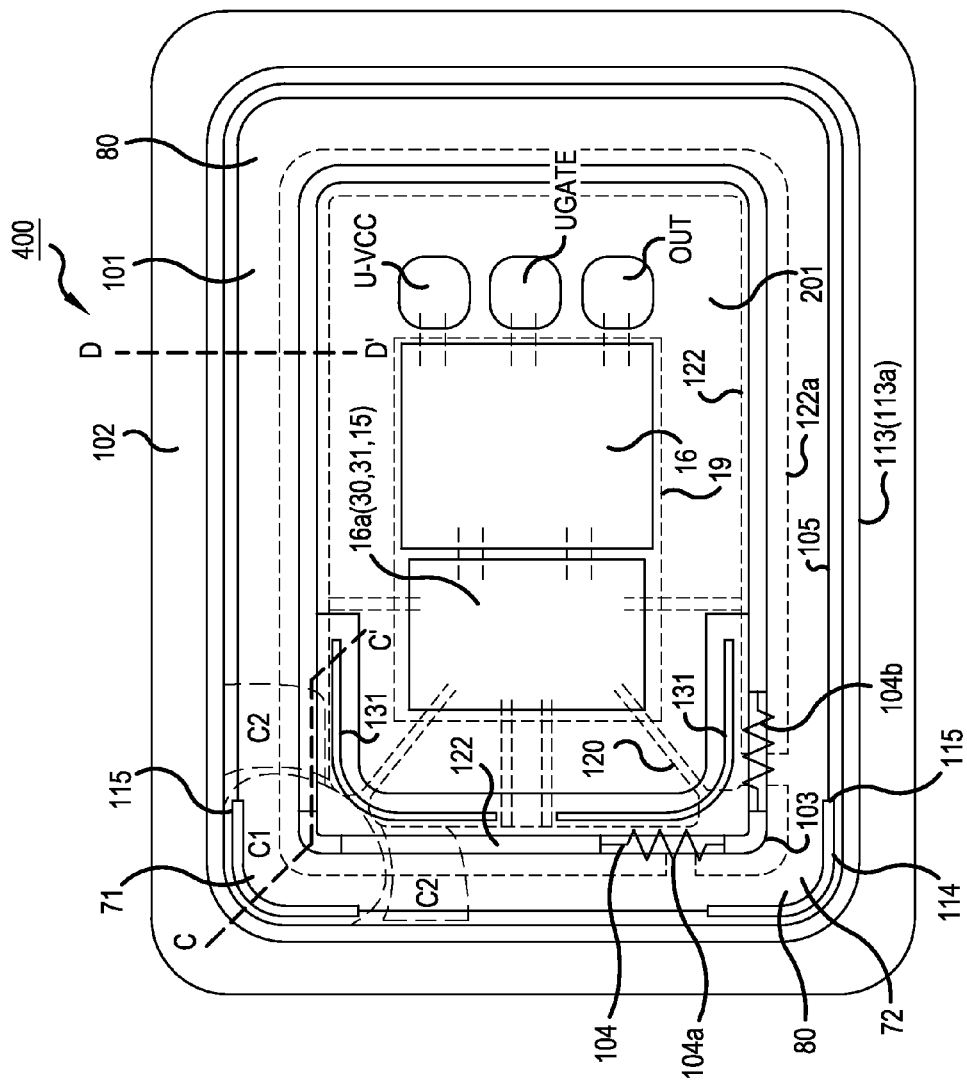
FIG. 3 is a plan view showing a main portion of a high voltage semiconductor device according to Embodiment 2 of the invention.

Next, a description will be given of a structure of a high voltage semiconductor device according to Embodiment 2. FIG. 3 is a plan view showing a main portion of the high voltage semiconductor device 400 according to Embodiment 2 of the invention. The high voltage semiconductor device 400 is a high voltage IC wherein a level shift circuit portion including high voltage MOSFETs 71 and 72 and a drive circuit including a floating potential region are formed on one semiconductor substrate. The difference of the high voltage semiconductor device 400 according to Embodiment 2 shown in FIG. 3 from the high voltage semiconductor device 300 according to Embodiment 1 shown in FIG. 1 is that the n+drain region 103 and n-type second pick-up region 122 are connected together, and an n buffer region 104 forming a load resistance element is formed in the surface layer of the n−region 101 which is the breakdown voltage region 80. The higher the impurity concentration of a portion of the n−region 101 sandwiched between the n+drain region 103 and n-type second pick-up region 122, the slower a change in the voltage dependence and temperature dependence of a diffusion resistance. Because of this, by providing the n buffer region 104 between the n+drain region 103 and n-type second pick-up region 122, it is possible to form a stable load resistance element with low dependence of the high voltage MOSFETs 71 and 72 on U-VCC voltage and temperature.

Figure 4A:
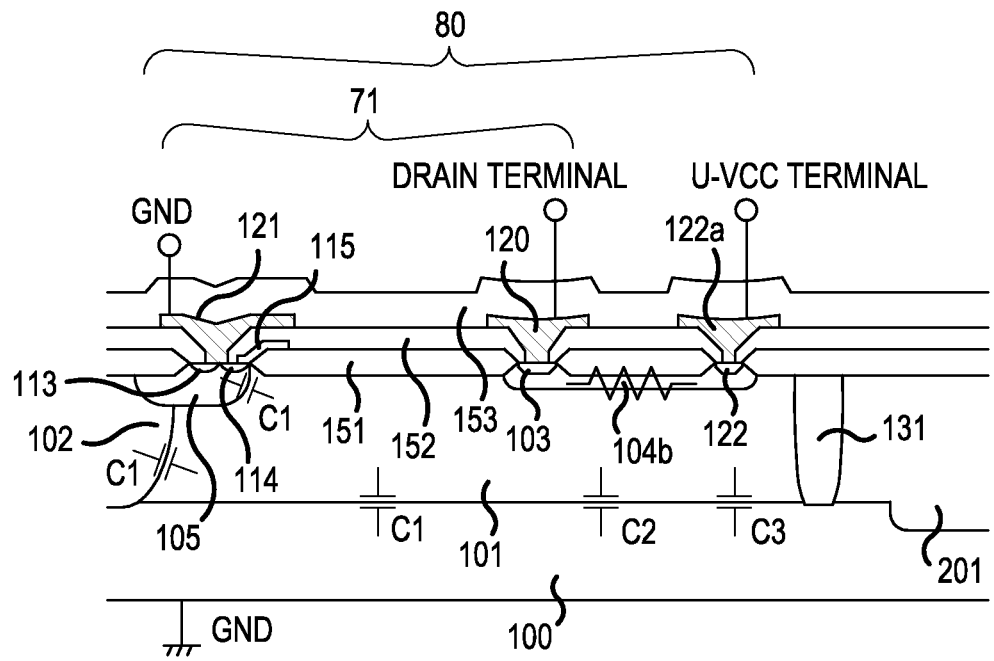
FIGS. 4(a) and 4(b) are sectional views showing a main portion of the high voltage semiconductor device according to Embodiment 2 of the invention.
Figure 4B:
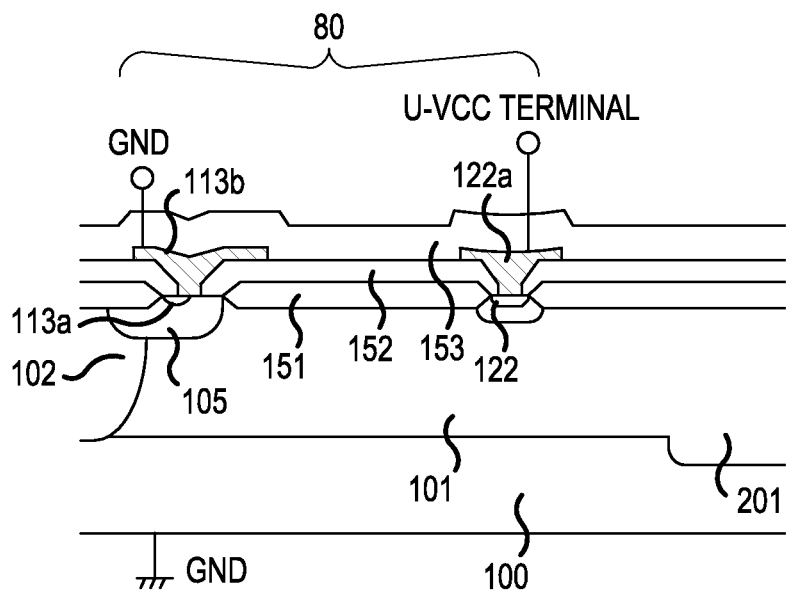

FIGS. 4(a) and 4(b) are sectional views showing a main portion of the high voltage semiconductor device 400 according to Embodiment 2 of the invention. FIG. 4(a) is a main portion sectional view showing a sectional structure along the section line C-C' of FIG. 3, while FIG. 4(b) is a main portion sectional view showing a sectional structure along the section line D-D' of FIG. 3, and is the same as the main portion sectional view shown in FIG. 2(b).

Figure 5:
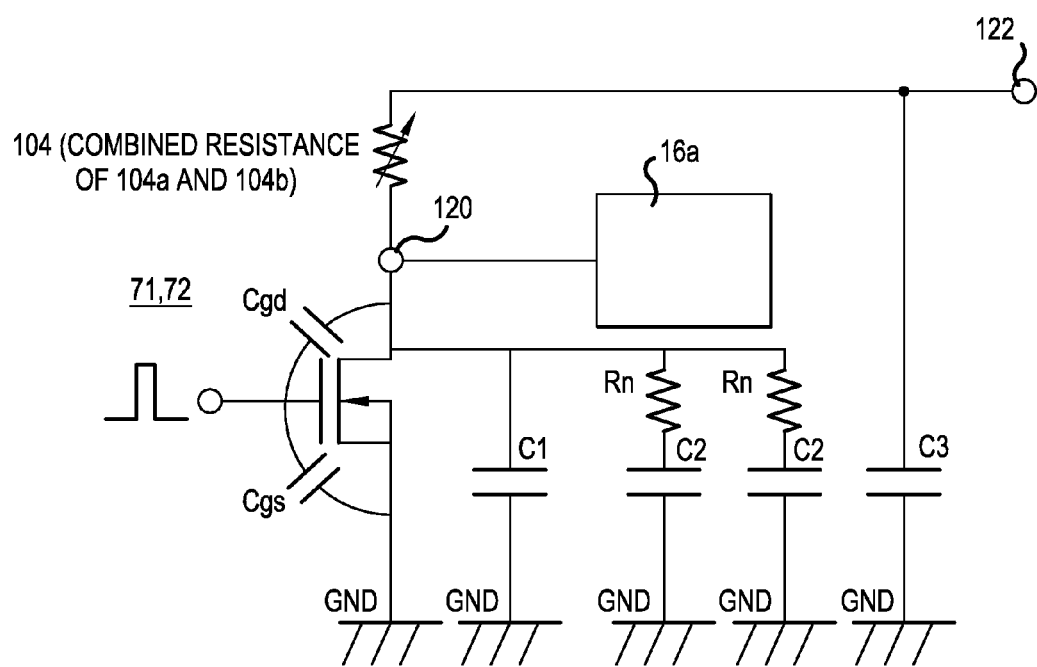
FIG. 5 is an output capacitance equivalent circuit diagram of a high voltage MOSFET in a level shift circuit of FIG. 3.

FIG. 5 is an output capacitance equivalent circuit diagram of the high voltage MOSFETs in the level shift circuit of FIG. 3. Rn in FIG. 5 are distributed constant-like resistance components (hereafter referred to as first parasitic resistance components) existing between the n+drain region 103 and parasitic junction capacitance components C2 of each high voltage MOSFET 71 and 72.

The high voltage MOSFETs 71 and 72 according to Embodiment 2 shown in FIG. 3 correspond respectively to the previously described high voltage MOSFET 71 and high voltage MOSFET 72 of FIG. 11. The level shift circuit portion including the high voltage MOSFET 71 includes the following regions. The n−region 101 and n well region 201 are provided in the surface layer of the p−silicon substrate 100. The n−region 101 is formed by selectively ion implanting, for example, phosphorous impurities into the p−silicon substrate 100 in a surface concentration range of $1 \times 10^{15}/cm^3$ to $1 \times 10^{16}/cm^3$, and diffusing the phosphorous impurities so that a predetermined diffusion depth Xj is reached by the subsequent heat treatment. The diffusion depth Xj of the n−region 101 may be, for example, on the order of 7 μm to 10 μm.

The n well region 201 is disposed on the order of 150 μm in an inward direction in plan away from the outer peripheral line of the n−region 101. The n well region 201 is formed by selectively ion implanting, for example, phosphorous impurities into the p−silicon substrate 100 in a surface concentration range of $1 \times 10^{16}/cm^3$ to $1 \times 10^{18}/cm^3$, and diffusing the phosphorous impurities so that a predetermined diffusion depth Xj is reached by the subsequent heat treatment. The diffusion depth Xj of the n well region 201 may be, for example, on the order of 10 μm to 15 μm. The n well region 201 is surrounded by the n−region 101.

Also, the p−well region 102, forming a separation region with other circuit regions, which is electrically connected to a COM potential is provided in the surface layer of the p−silicon substrate 100. The p−well region 102 is formed by selectively ion implanting, for example, boron impurities into the p−silicon substrate 100 in a surface concentration range of $1 \times 10^{15}/cm^3$ to $1 \times 10^{19}/cm^3$, and diffusing the boron impurities so that a predetermined diffusion depth Xj is reached by the subsequent heat treatment. The diffusion depth Xj of the p−well region 102 may be, for example, on the order of 10 μm to 13 μm.

The portion 131 reaching the p−silicon substrate 100 from the n−region 101 surface is selectively provided inside the n−region 101. The p−opening portion 131 is formed by selectively ion implanting, for example, boron impurities into the n−region 101 in a surface concentration range of $1 \times 10^{14}/cm^3$ to $1 \times 10^{17}/cm^3$, and diffusing the boron impurities so that a predetermined diffusion depth Xj is reached by the subsequent heat treatment. The diffusion depth Xj of the p⁻opening portion 131 may be, for example, on the order of 7 μm to 10 μm.

The n⁻region 101, n well region 201, p⁻well region 102, and p⁻opening portion 131, in order to share a manufacturing process, may be formed by being collectively driven (thermally diffused) so that a predetermined diffusion depth is reached by a heat treatment at a high temperature of 1100° C. or more in a nitrogen atmosphere. Also, the p⁻opening portion 131 is not formed using a p-type high impurity diffusion, and the n⁻region 101 (the left side on the plane) and n well region 201 (the right side on the plane) may be formed away from each other, and formed with a portion of the p⁻silicon substrate 100 sandwiched between the n⁻region 101 and n well region 201 exposed to the surface. Also, the p⁻opening portion 131 may be formed by forming a trench in the p⁻silicon substrate 100 and burying an insulating body in the trench.

By providing the p⁻opening portion 131, it is possible to raise the resistance between the n well region 201, which is a high potential region and in which is formed a shift register, and the n⁺drain region 103. Next, the p base region 105 is formed in a surface layer at the boundary of the n⁻region 101 and p⁻well region 102. The p base region 105 functions as the channel region of the high voltage MOSFETs 71 and 72. The p base region 105 is formed by selectively ion implanting, for example, boron impurities into the n⁻region 101 and p⁻well region 102 in a surface concentration range of $1\times10^{16}/cm^3$ to $1\times10^{19}/cm^3$, and diffusing the boron impurities so that a predetermined diffusion depth Xj is reached by the subsequent heat treatment. The diffusion depth Xj of the p base region 105 may be, for example, on the order of 3.0 μm to 6 μm.

Also, the n buffer region 104 is formed, away from the p base region 105, in the surface layer of the n⁻region 101. The n buffer region 104 is formed by selectively ion implanting, for example, phosphorous impurities into the n⁻region 101 in a surface concentration range of $1\times10^{16}/cm^3$ to $1\times10^{20}/cm^3$, and diffusing the phosphorous impurities so that a predetermined diffusion depth Xj is reached by the subsequent heat treatment. The diffusion depth Xj of the n buffer region 104 may be, for example, on the order of 0.2 μm to 15 μm.

Normally, the n buffer region 104 is drive formed to a diffusion depth of on the order of 3 μm, together with the drive process of forming an offset drain layer of the MOSFETs with a breakdown voltage of on the order of 15V configuring the logic circuit portion. The n buffer region 104, when the diffusion depth Xj thereof is as deep as, for example, 15 μm, may be formed by the same diffusion process as with the heretofore described n well region 201. Also, the n buffer region 104, when the diffusion depth thereof is formed to be shallow, for example, to on the order of 0.2 μm, can be formed by an annealing treatment when forming the n⁺source region 114 and n⁺drain region 103, to be described hereafter.

Next, the p⁺region (first pick-up region) 113 and the n⁺source region 114 of each high voltage MOSFET 71 and 72 are formed inside the p base region 105. Subsequently, the n⁺drain region 103 of each high voltage MOSFET 71 and 72 and the second pick-up region 122 are formed inside the n buffer region 104. The p⁺ region 113, n⁺source region 114, and n⁺drain region 103 are formed by ion implanting p-type impurities, n-type impurities, and n-type impurities, respectively, so that the surface concentrations are equal to or higher than $1\times10^{20}/cm^3$, and diffusing the p-type impurities and n-type impurities so that a predetermined diffusion depth Xj is reached by the subsequent annealing treatment. The diffusion depths Xj of the p⁺region 113, n⁺source region 114, and n⁺drain region 103 may be, for example, approximately 0.2 to 0.5 μm.

The second pick-up region 122 functioning as the pick-up region of a U-VCC potential region is formed by being ion implanted and anneal treated by the same process as with the n⁺drain region 103. In the manufacturing process, the gate electrode 115 of each high voltage MOSFET 71 and 72, formed from, for example, polysilicon, is formed via a gate oxide film on the surface of a portion of the p base region 105 sandwiched between the n⁺source region 114 and n⁻region 101. Also, the drain electrode 120 of each high voltage MOSFET 71 and 72 connected to the n⁺drain region 103, the source electrode 121 of each high voltage MOSFET 71 and 72 connected to the n⁺source region 114, and the second pick-up electrode 122a connected to the second pick-up region 122, are formed from an aluminium-based material.

The gate electrode 115, drain electrode 120, source electrode 121, and second pick-up electrode 122a are electrically insulated from one another by interlayer insulating films. A field oxide film LOCOS151, an interlayer insulating film (a silicon oxide film) 152 formed from TEOS (tetraethoxysilan), BPSG (Boro Phospho Silicate Glass), or the like, and a passivation film 153 formed of a silicon oxide film and silicon nitride film formed by plasma CVD, are provided as the interlayer insulating films.

Figure 16:
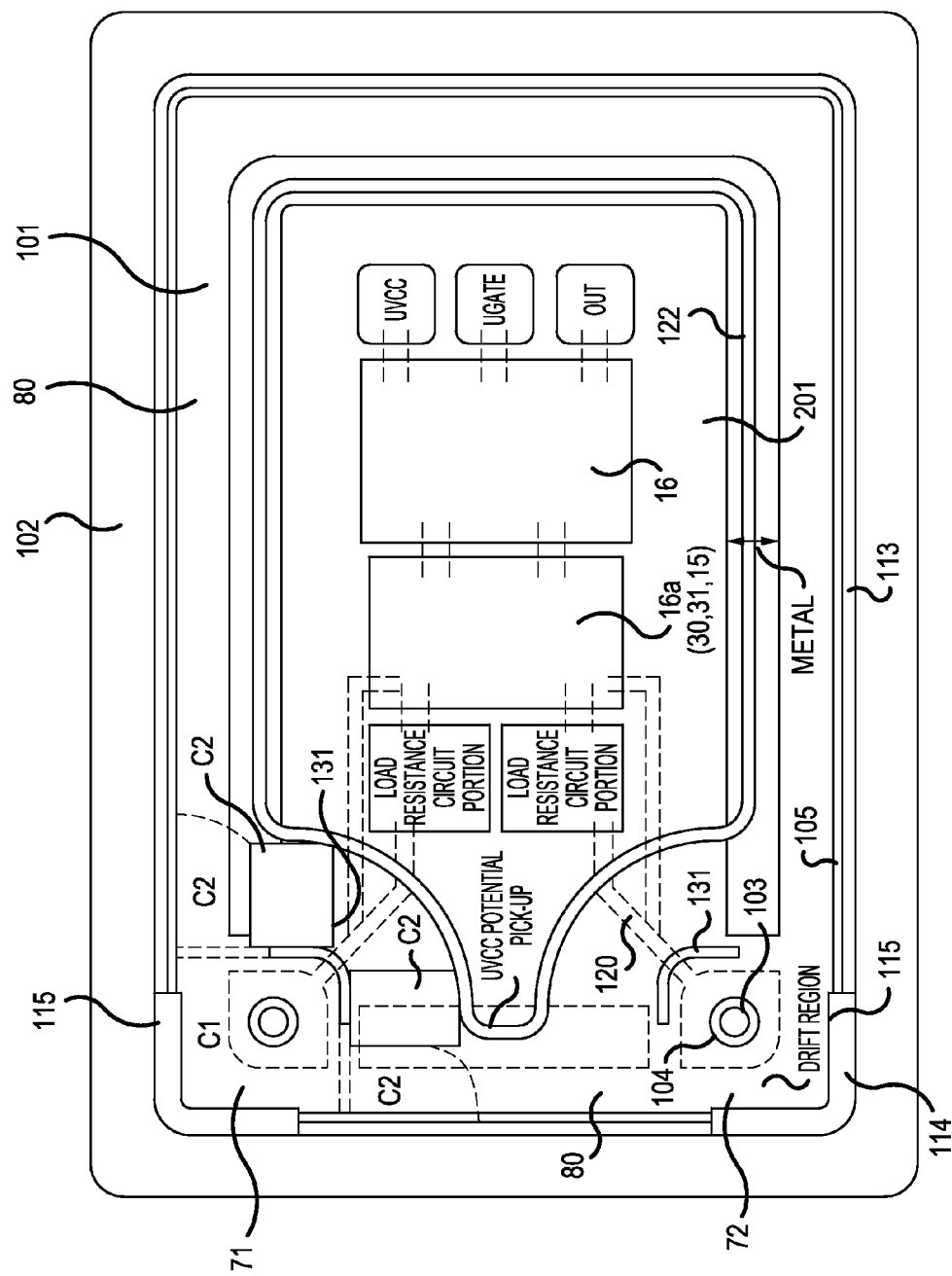
FIG. 16 is a plan view showing parasitic output capacitance components of high voltage MOSFETs of a heretofore known example.

The invention adopts a configuration (the n buffer region 104) wherein the n⁻region 101 between the drain region 103 of each high voltage MOSFET 71 and 72 and the second pick-up region 122 is made to be a level shift load resistance. Because of this, it is not necessary to increase the total resistance value of the n⁻region 101 used as the load resistance. As opposed to this, in a level shift circuit system of a heretofore known example such as in the heretofore described PTL 2, polysilicon or the like is used as a load resistance element, and the load resistance element is provided in parallel with the n⁻region 101. Because of this, it is necessary to increase the total resistance value of the n⁻region 101. As a result of this, the second pick-up region 122 has to be formed apart in space from the n⁺drain region 103. Consequently, in a heretofore known example such as in the heretofore described PTL 2, parasitic junction capacitance components C2 (shown in FIG. 16) are formed, over a wide range, in parallel with an output capacitance Coss (the junction capacitance C1) between the drain and source of each high voltage MOSFET 71 and 72. Because of this, the total amount of the output capacitance Coss between the drain and source of each high voltage MOSFET 71 and 72 is very high, as represented by Coss=C1+(2×C2).

FIG. 5 shows an equivalent circuit diagram in which are described capacitance components associated with the level shift circuit of the invention. In the invention, the n buffer region 104 is disposed connected from the n⁺drain region 103 to the second pick-up region 122. Herein, as one example, a load resistance (a parallel combined resistance of 104a and 104b) formed in the n buffer region 104 which is the load resistance region of the invention are formed by adjusting the distance to the second pick-up region 122, the width of the n buffer region 104, and the like, so that a resistance value of 5KΩ is reached, in a condition in which a potential difference of 15V is applied between the U-VCC and ground at room temperature (for example, on the order of 25° C.). Herein, the n buffer region 104 forming the load resistances 104a and 104b is set to have a width of 5 μm and a length of 100 μm. The width of the n buffer region 104 is a width in a direction crossing the n buffer region 104 from the n well region 201 side toward the p⁻well region 102 side. The length of the n buffer region 104 is a length in a direction perpendicular to the width of the n buffer region 104.

In this way, in the invention, the load resistance from the n$^+$drain region 103 to the second pick-up region 122 of each high voltage MOSFET 71 and 72 is set to be low. Because of this, most of the junction resistance components, in the n$^-$region 101 which is the breakdown region 80, existing in parallel with the output capacitance Coss (junction capacitance C1) from the n$^+$drain region 103 to the ground region of each high voltage MOSFET 71 and 72 are included in a junction capacitance component C3 from the second pick-up region 122 to the ground region shown in FIG. 5. As a result of this, it is possible to reduce the parasitic junction capacitance components C2, between the n$^-$region 101 which is the breakdown region 80 existing in parallel with the output capacitance Coss (junction capacitance C1) from the n$^+$drain region 103 to the ground region of each high voltage MOSFET 71 and 72 and the ground region, to the size of the region shown in FIG. 3. By so doing, a net output capacitance Ctotal of each high voltage MOSFET 71 and 72 in the invention is represented by Ctotal=C1+(2×C2), and becomes lower than an output capacitance Ctotal of each high voltage MOSFET of a heretofore known example, shown in FIG. 15, by the amount in which the parasitic junction capacitance components C2 can be reduced. This can be realized in the following way.

The second pick-up region 122 is disposed close to the n$^+$drain region 103. Also, the p$^-$opening portion 131 is formed so as to extend parallel to the direction of the second pick-up region 122 from the n$^+$drain region 103. By so doing, it is possible to adopt an arrangement such that one portion of the junction capacitance components C2 existing in the vicinity of the n well region 201 while wrapping around the p$^-$opening portion 131 does not join the output capacitance Coss from the n$^+$drain region 103 to the ground region. Consequently, as the net output capacitance Ctotal of each high voltage MOSFET 71 and 72 can be lowered by several pF, it is possible to realize a circuit wherein the amount of decrease in the potential of the drain node of each high voltage MOSFET 71 and 72 due to a dV/dt surge decreases, and it is difficult to malfunction.

Also, in FIG. 3, the distance between the set side high voltage MOSFET 71 and reset side high voltage MOSFET 72 is depicted as being shorter because of the scale of the illustration, but in the actual layout, an arrangement is such that the drain of the set side high voltage MOSFET 71 and the drain of the reset side high voltage MOSFET 72 are prevented from being connected by a low resistance. Specifically, the n$^+$drain regions 103 of the high voltage MOSFETs 71 and 72 are disposed several hundred μm or more away from each other. By so doing, an arrangement is such that an input signal to the high voltage MOSFET 71 or an input signal to the high voltage MOSFET 72 is prevented from being respectively transmitted to the high voltage MOSFET 72 or the high voltage MOSFET 71 as an erroneous signal.

Also, all of the n$^-$region 101 between the p$^-$well region 102 and p$^-$opening portion 131 and the p$^-$opening portion 131 are completely depleted when a high voltage (for example, 1200V) is applied to the drain electrode 120. Breakdown voltage characteristics provided by adopting the heretofore described structure of the invention are not adversely affected by so doing. In particular, the p$^-$opening portion 131 attains a uniform gradient of potential which is higher than that of the p$^-$silicon substrate 100 by depletion layers, formed one at each end of an opening lower portion, which extend from the junction surface between the n$^-$region 101 and p$^-$opening portion 131, coming into contact with each other.

It is necessary to prevent the n$^+$region with high concentration from being formed around the p$^-$opening portion 131 so that no breakdown occurs in the p$^-$opening portion 131 when a high voltage (for example, 1200V) is applied to a drain terminal and U-VCC terminal. For example, the p$^-$opening portion 131 and n buffer region 104 are disposed 20 μm or more away from each other. Also, when the opening width of the p$^-$opening portion 131 is too large, the opening lower portion is not completely depleted, and there is fear that a breakdown voltage is limited in the opening lower portion, meaning that it is desirable that the opening width of the p$^-$opening portion 131 is on the order of 10 μm to 20 μm. In the invention, in addition to the heretofore described conditions of the p$^-$opening portion 131, the p$^-$opening portion 131 is formed so as not to fall in the breakdown voltage region 80. Because of this, there is no region with locally high electric field intensity, and it is possible to obtain stable breakdown voltage characteristics.

Also, in the invention, a diffusion resistance portion of the breakdown voltage region 80 (n$^-$region 101) adjacent to an n$^-$drift region 81 of each high voltage MOSFET 71 and 72 is used as the level shift resistances (load resistances 104a and 104b) of the level shift circuit. In this case, by the potentials of an OUT terminal and the U-VCC terminal varying from a low voltage (a ground potential) to a high voltage (the high potential of a high voltage power source) depending on a switching condition of a power device, the diffusion resistance portions form variable resistance elements which are affected by depletion.

Figure 6:
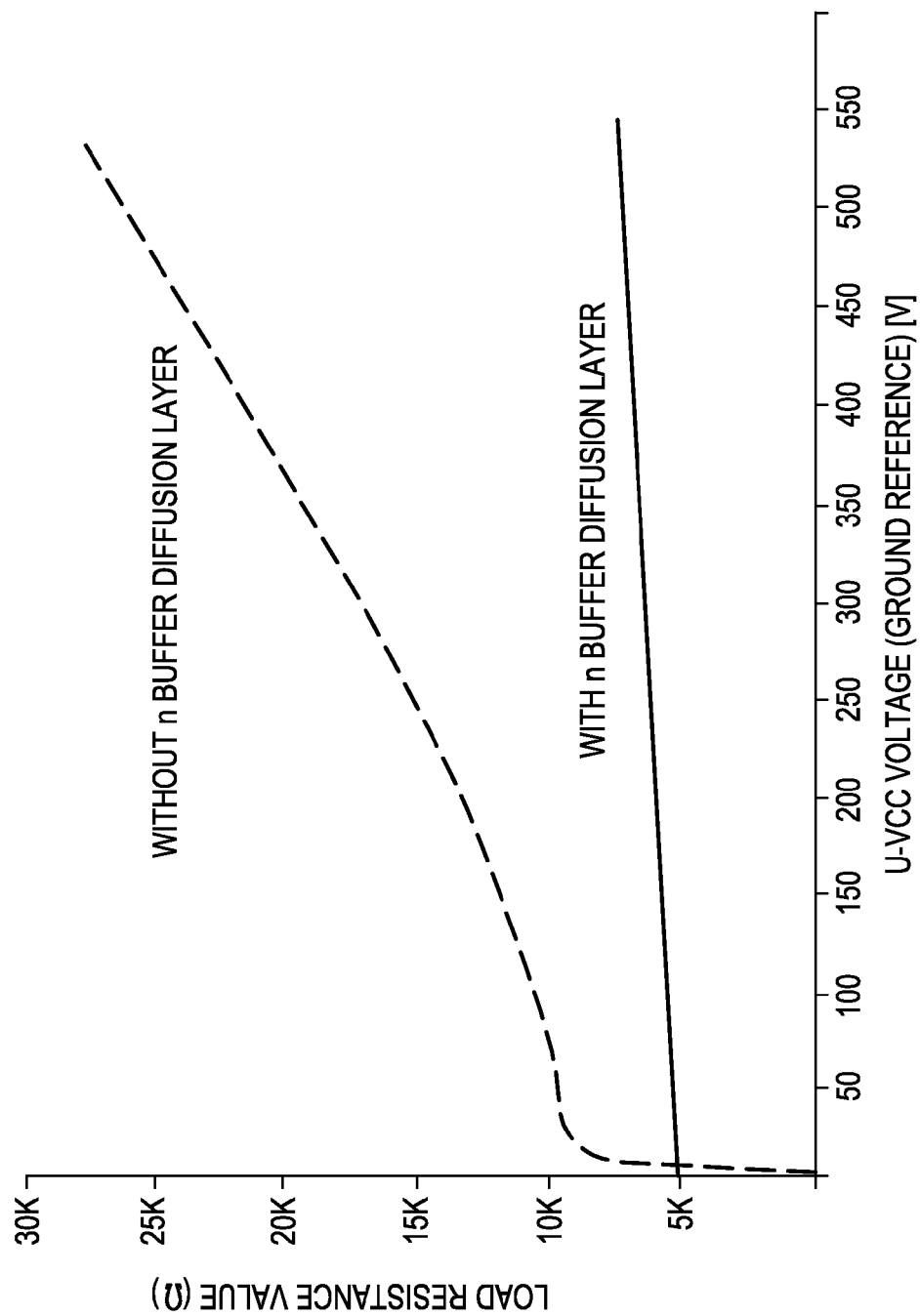
FIG. 6 is a characteristic diagram showing the U-VCC potential dependence of the high voltage semiconductor devices according to Embodiments 1 and 2.

A description will be given of the voltage dependence of the load resistances 104a and 104b when the n buffer region 104 is disposed in the heretofore described diffusion resistance region, and when the n buffer region 104 is not disposed therein and only the n$^-$region 101 exists. FIG. 6 is a characteristic diagram showing the U-VCC potential dependences of the high voltage semiconductor devices according to Embodiments 1 and 2. As shown in FIG. 6, by forming the n buffer region 104 in the load resistance region, no depleted pinch resistance is formed when a high voltage is applied between the ground region and U-VCC potential region (n well region 201), meaning that the voltage dependence is gentle.

As a result of this, as it does not happen that the level shift resistances (load resistances 104a and 104b) increase to an extreme degree depending on a U-VCC potential condition, it is possible to configure a stable level shift circuit with less potential dependence of input/output transmission delay time.

The above description has been given by taking for example a case in which the n$^-$region 101 is formed by diffusing impurities, but the n$^-$region 101 may be formed on the p$^-$silicon substrate 100 by an epitaxial growth. In this case, it is good that the impurity concentration of the n$^-$region 101 is in a range of $1\times10^{14}/cm^3$ to $1\times10^{16}/cm^3$. Also, the n$^-$region 101 may be an n$^-$SOI layer formed on an SOI (Silicon on Insulator) substrate. In the following Embodiments 3 to 5 too, in the same way, it is possible to obtain the same advantageous effects even by replacing the n$^-$region 101 formed of the diffusion region with the n$^-$region formed by an epitaxial growth or the n$^-$SOI layer formed on the SOI (Silicon on Insulator) substrate.

The advantageous effects obtained in the heretofore described Embodiments 1 and 2 are summarized in the following (A) to (F). (A) The level shift resistances (load resistances) of the level shift circuit can be formed in the breakdown voltage region (high voltage junction terminal region: HVJT) without using polysilicon. Because of this, it is not necessary to provide a region in which to form the load resistances separately, and it is possible to reduce the area of the level shift circuit portion. Because of this, an increase in chip area is suppressed, and no high resistance polysilicon formation step is necessary either, thus resulting in a reduction in price.

(B) As it is possible to form a high voltage transistor (the high voltage MOSFET) into a layout shape in which it is integrated with the breakdown voltage region, it is possible to realize a significant reduction in the area of the high voltage IC (high voltage semiconductor device). (C) It is possible to lower the output capacitance of the high voltage transistor (high voltage MOSFET) by disposing the high potential side pick-up region of the high side drive circuit between the p⁻ opening portion and breakdown voltage region. As a result of this, as the charge/discharge of the output capacitance becomes faster when an on signal is input into the gate of the high voltage transistor, it is possible to shorten the input/output transmission delay time of the high side drive circuit portion. By the transmission delay time being shortened, it is also possible to set an on duty which drives the high voltage transistor to be small. Consequently, it is also possible to lower the level shift load resistances with allowable dissipation being maintained.

(D) As a result of being able to obtain the advantageous effect of the heretofore described (C), both the displacement currents when the dV/dt surge occurs and the load resistances (level shift resistances) are lowered while a power loss in the level shift circuit portion is being suppressed. Because of this, a voltage drop in the load resistances decreases, and it is possible to realize a drive circuit wherein it is difficult for a malfunction and an increase in transmission delay to occur due to the dV/dt surge.

(E) By using the surface layer of the breakdown voltage region (n⁻ region) between the second pick-up electrode and drain electrode as the level shift resistance, it is possible to obtain the following advantageous effects (1) to (3). (1) There is no more need to provide the region in which to form the load resistances (the region in which to form the load resistance elements) in a region in which to form the high side logic circuit portion (logic circuit portion), and it is possible to reduce the size of chips. (2) It is possible to optionally set the resistance value of the load resistances with high accuracy and less variation simply by taking the distance between the second pick-up electrode and drain electrode as a parameter. (3) It is possible to reduce the parasitic junction capacitance components of the high voltage MOSFET (C2 decreases in size).

(F) It is possible to invalidate the parasitic junction capacitance components of the high voltage MOSFET in accordance with a switching frequency under practical use conditions without adversely affecting the breakdown voltage characteristics of the high voltage transistor, and minimize the output capacitance of the high voltage MOSFET. Because of this, it is possible to provide a high voltage transistor and level shift circuit which are high in switching response speed.

As heretofore described, according to Embodiments 1 and 2, by forming the p⁻ opening portion, and using the breakdown voltage region between the second pick-up region and drain region or the buffer region as the load resistance, it is possible to realize a reduction in the area of chips, and suppress a circuit malfunction and increase in transmission delay time accompanied by the power loss and dV/dt surge when switching. By so doing, it is possible to provide a high voltage semiconductor device and drive circuit having a level shift circuit high in switching response speed.

Also, according to Embodiment 2, current flows with the n buffer region as a main current path by further providing the n buffer region in the surface layer of the breakdown voltage structure between the second pick-up electrode and drain electrode. As a result of this, it is possible to lessen the potential dependence and temperature dependence of the load resistances, thus enabling a stable level shift circuit operation with a small change in transmission delay time in a desired voltage range.

(Embodiment 3)

Figure 7:
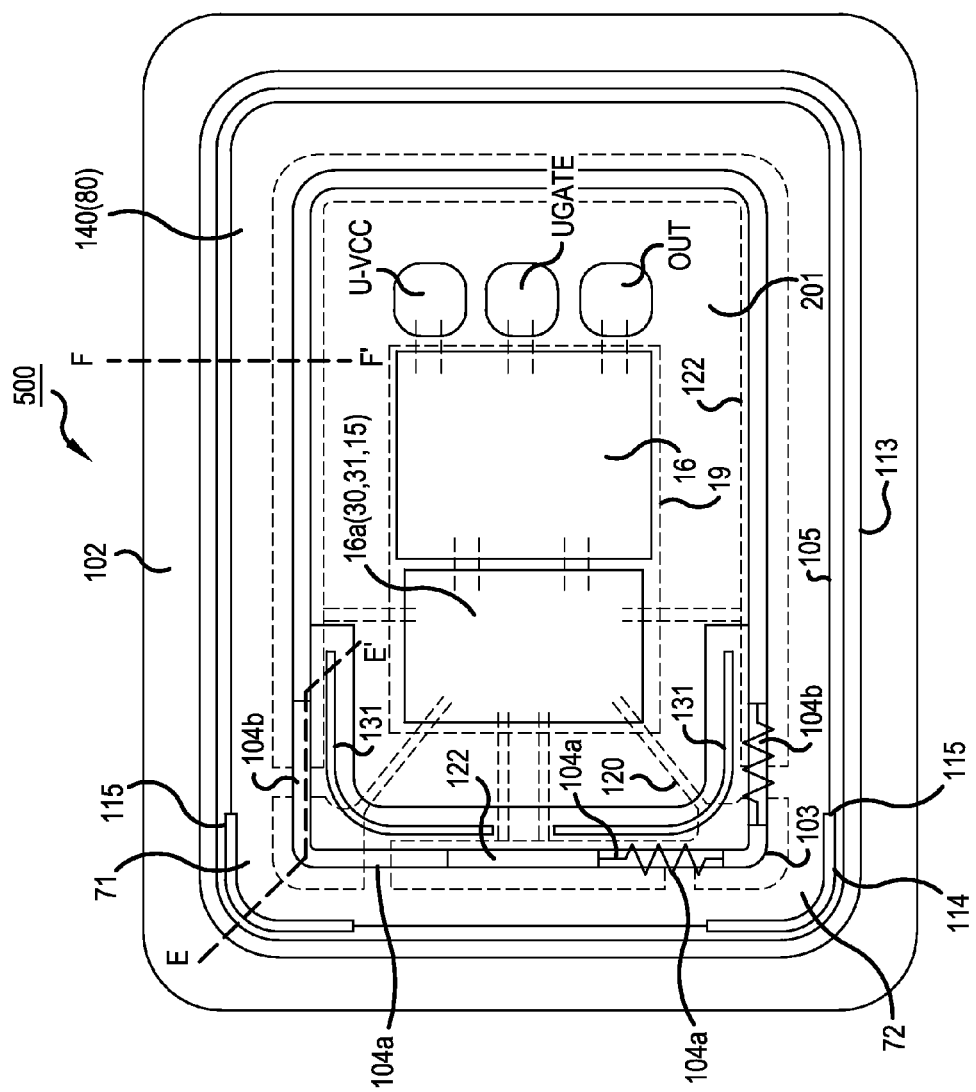
FIG. 7 is a plan view showing a main portion of a high voltage semiconductor device according to Embodiment 3 of the invention.
Figure 8A:
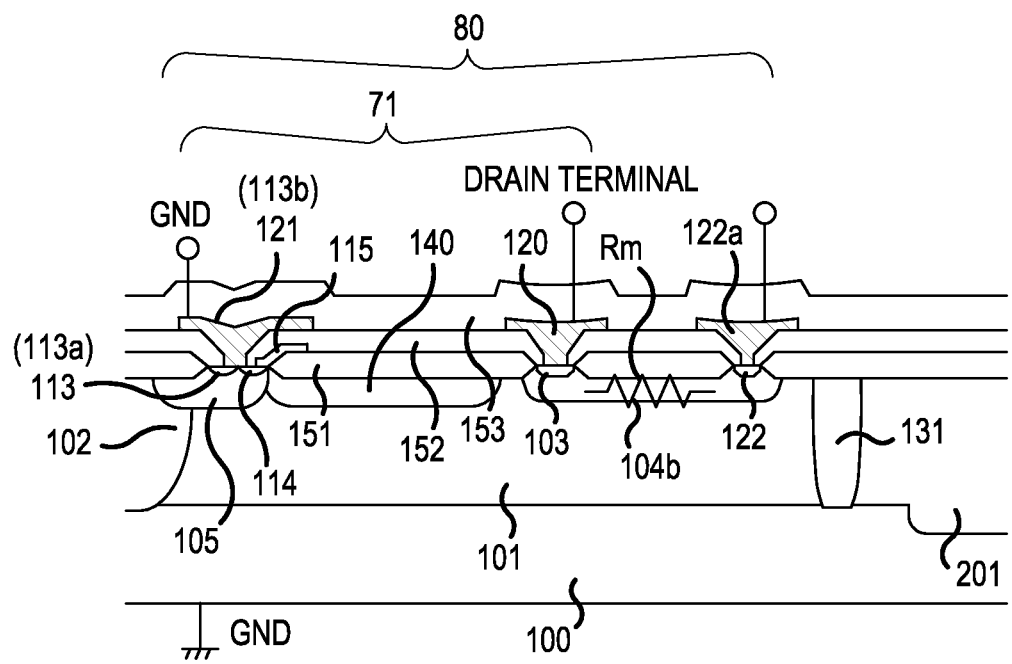
FIGS. 8(a) and 8(b) are sectional views showing a main portion of the high voltage semiconductor device according to Embodiment 3 of the invention.
Figure 8B:
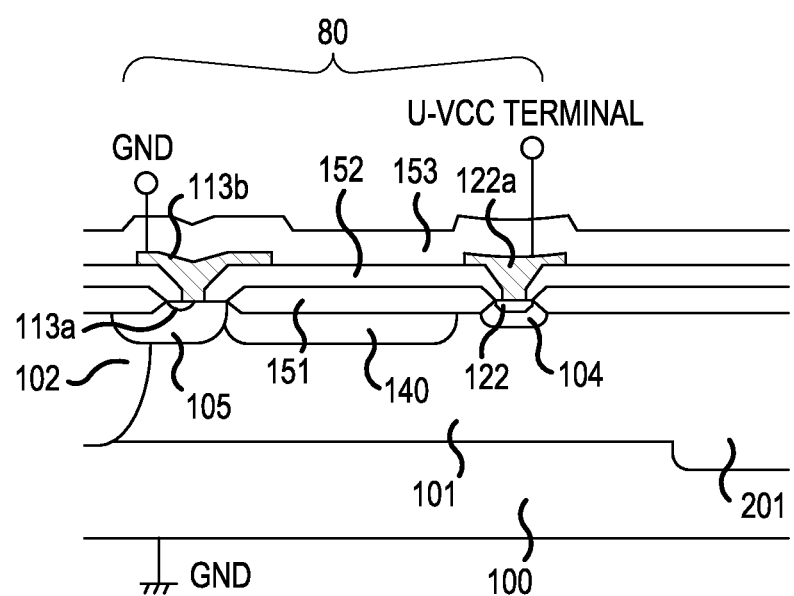

Next, a description will be given of a structure of a high voltage semiconductor device according to Embodiment 3. FIG. 7 is a plan view showing a main portion of the high voltage semiconductor device 500 according to Embodiment 3 of the invention. FIGS. 8(a) and 8(b) are sectional views showing a main portion of the high voltage semiconductor device 500 according to Embodiment 3 of the invention. FIG. 8(a) is a main portion sectional view showing a sectional structure along the section line E-E' of FIG. 7. FIG. 8(b) is a main portion sectional view showing a sectional structure along the section line F-F' of FIG. 7. The high voltage semiconductor device 500 according to Embodiment 3 is a high voltage IC wherein a level shift circuit portion including high voltage MOSFETs and a drive circuit including a floating potential region are formed on one semiconductor substrate.

The difference of the high voltage semiconductor device 500 according to Embodiment 3 shown in FIG. 7 from the high voltage semiconductor device 300 according to Embodiment 2 shown in FIG. 3 is that a double RESURF structure is adopted wherein a p offset region 140 is provided on the breakdown voltage region 80 (n⁻ region 101) surface of the high voltage MOSFETs 71 and 72 and HVJT (high voltage junction terminal region). The p offset region 140 has to be connected to at least one of the p base region 105 or second pick-up region 122. The p offset region 140 may be connected to both the p base region 105 and second pick-up region 122. It is easier to heighten the breakdown voltage when the p offset region 140 is connected to both the p base region 105 and second pick-up region 122.

In particular, in the case of a high voltage IC of a 1200V breakdown voltage level, it is necessary to raise the high breakdown voltage to 1500V or more. Normally, the double RESURF structure wherein the p offset region 140 is formed on the n⁻ region 101 surface is used in order to alleviate the surface electric field of the breakdown voltage region 80. The formation condition of the p offset region 140 is such that the p offset region 140 is formed by mutually adjusting the impurity concentrations of the n⁻ region 101 and p offset region 140 so as to be completely depleted on the junction surface between the n⁻ region 101 and p offset region 140 when a high potential (for example, 1200V) is applied to the n⁺ drain region 103 and second pick-up region 122. Because of this, it is desirable that a diffusion depth Xj of the p offset region 140 is a diffusion depth of 1 μm to 5 μm at which it is easy to deplete the p offset region 140.

Furthermore, in order to make it easy to completely deplete the p offset region 140, it is desirable that the p offset region 140 is in contact with one of the p base region 105 or p⁻ opening portion 131, or with both of the p base region 105 and p⁻ opening portion 131.

By employing the double RESURF structure of Embodiment 3, it is conceivable that, for example, the resistance value of the level shift load resistance portions is greater, and the output capacitance Coss (junction capacitance C1) of each high voltage MOSFET 71 and 72 is higher, than with a single RESURF structure. However, in the structure of the high voltage MOSFETs according to Embodiment 3 too, in the same way as in Embodiment 1, it is possible to lower the output capacitance between the drain and ground of each high voltage MOSFET and stabilize the level shift resistances.

As heretofore described, according to Embodiment 3, it is possible to obtain the same advantageous effects as those of Embodiments 1 and 2.

(Embodiment 4)

Figure 9:
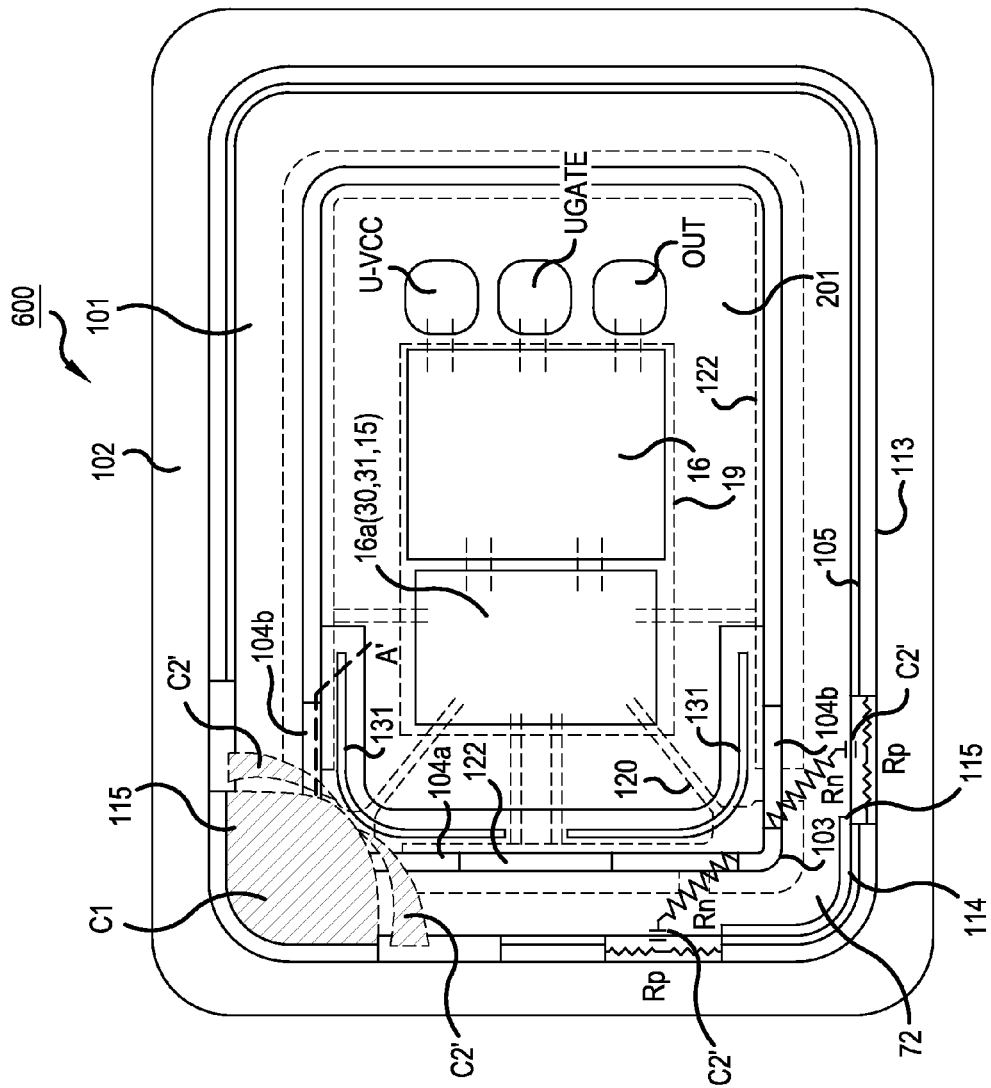
FIG. 9 is a plan view showing a main portion of a high voltage semiconductor device according to Embodiment 4 of the invention.

Next, a description will be given of a structure of a high voltage semiconductor device according to Embodiment 4. FIG. 9 is a plan view showing a main portion of the high voltage semiconductor device 600 according to Embodiment 4 of the invention. The high voltage semiconductor device 600 according to Embodiment 4 is a high voltage IC wherein a level shift circuit portion including high voltage MOSFETs and a drive circuit including a floating potential region are formed on one semiconductor substrate.

Figure 10:
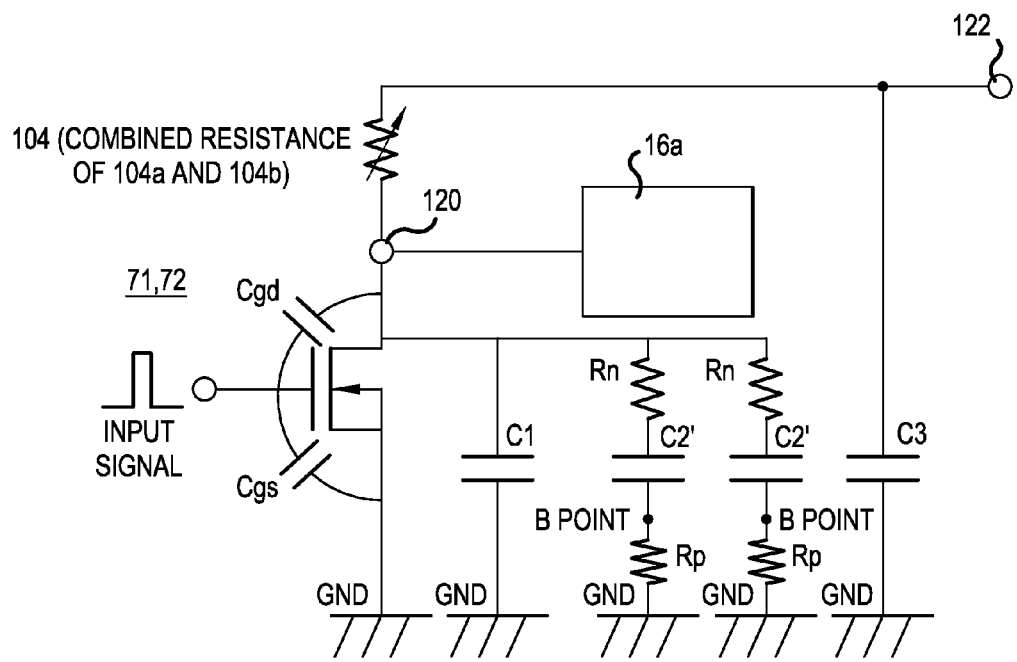
FIG. 10 is an output capacitance equivalent circuit diagram of a high voltage MOSFET in a level shift circuit of FIG. 9.

FIG. 10 is an output capacitance equivalent circuit diagram of the high voltage MOSFET in the level shift circuit of FIG. 9. The difference of the high voltage semiconductor device 600 according to Embodiment 4 shown in FIG. 9 from the high voltage semiconductor device 300 according to Embodiment 2 shown in FIG. 3 is that a region in which the p$^+$region (first pick-up region) 113 is not formed is selectively provided in the p base region 105 opposite to the n$^-$region 101 adjacent to the n$^-$drift region 81 of each high voltage MOSFET 71 and 72, thereby reducing the parasitic junction capacitance components.

By adopting this structure, as shown by the B points in FIG. 10, parasitic resistance components (hereafter referred to as second parasitic resistance components) Rp from the pn junction portion of the p base region 105 and breakdown voltage region 80 (n$^-$region 101) to the p$^+$region 113 disposed in a position closest thereto are equivalent to those in a case in which each Rp is connected in series to a parasitic junction capacitance component C2'.

At this time, it is possible to reduce the parasitic junction capacitance components C2' by setting the second parasitic resistance components Rp so that a total resistance value Rn+Rp of a first parasitic resistance component Rn and each respective second parasitic resistance component Rp satisfies Rn+Rp≥(2π×Cn×fc)−1. The first parasitic resistance components Rn are parasitic resistance components in the n$^-$region 101 adjacent to the n$^-$drift region 81 shown in FIG. 9. The second parasitic resistance component Rp is a parasitic resistance component in a portion of the p base region 105 shown in FIG. 9 in which the p$^+$region 113 is not formed. Cn is each parasitic junction capacitance component C2' shown in FIG. 9. fc is a cutoff frequency.

As a result of this, the parasitic junction capacitance components C2 shown in FIG. 5 are reduced to the parasitic junction capacitance components C2' shown in FIG. 9. By so doing, the output capacitance Ctotal of each high voltage MOSFET 71 and 72 is represented by Ctotal=C1+(2×C2'), and it is possible to make the output capacitance Ctotal still lower than the output capacitance of each high voltage MOSFET 71 and 72 according to Embodiment 2 in FIG. 3 by the amount in which the parasitic junction capacitance components C2' can be reduced.

A description will be given of a relationship between the parasitic junction capacitance components C2', existing in parallel with the output capacitance Coss (junction capacitance C1) of the high voltage MOSFET of the invention, which is configured of the n$^-$region 101 and p base region 105, and the cutoff frequency. Each high voltage MOSFET 71 and 72 of the invention is used as, for example, a level shift element which carries out an exchange of signals between a high side drive circuit and low voltage circuit region of an HVIC. In the case of the field of a power source of a liquid crystal panel driver IC or the like, the switching frequency is used as a high oscillation frequency of on the order of 100 kHz to 1 MHz.

Meanwhile, the parasitic output capacitance (C1=Cds+Cd-sub) when voltage is applied to the drain terminal of each high voltage MOSFET 71 and 72 in FIG. 10 is on the order of 10 pF at a 1200V breakdown voltage level. The parasitic junction capacitance components C2' existing in parallel with this output capacitance Coss are of the order of 1 pF when no second parasitic resistance component Rp exists (of the order of 2 pF with the parasitic junction capacitance components C2' existing one on each side of each high voltage MOSFET). Each side of each high voltage MOSFET is an end portion side in the channel width direction (in a direction along the annular n$^-$region 101) of each high voltage MOSFET.

Therefore, in Embodiment 4, the region in which the p$^+$region 113 is not formed is provided in one portion of the p base region 105 opposite to the n$^-$region 101 adjacent to the n$^-$drift region 81 of each high voltage MOSFET 71 and 72, as described in FIG. 10. In this case, a CR cutoff frequency in the parasitic junction capacitance components C2' existing in parallel with the output capacitance Coss (junction capacitance C1) of the high voltage MOSFET, the first parasitic resistance components Rn in the n$^-$region 101 adjacent to the n$^-$drift region 81, and the second parasitic resistance components Rp in the portion in which the p$^+$region 113 is not formed, are computed by the following expression (I).

$$fc=1/2\pi C(Rn+Rp) \quad (I)$$

For example, with a switching frequency of 100 kHz of a high voltage IC, in order to reduce the parasitic junction capacitance components C2' existing in parallel in the high voltage MOSFET, it is sufficient that the parasitic junction capacitance components C2' can be invalidated in a period of rise time or fall time for which the high voltage MOSFETs 71 and 72 turn on or off. Because of this, when the rise time and fall time of the high voltage MOSFETs 71 and 72 are set to on the order of 20 ns, 20 ns is converted to a frequency of 50 MHz. Also, in the circuit diagram shown in FIG. 11, in the event that the period for which the dV/dt surge is input is 20 ns even when lowering the junction capacitance of the high voltage MOSFETs 71 and 72 in a period for which the dV/dt surge is input into the OUT terminal, 20 ns is converted to a frequency of 50 MHz in the same way. Consequently, a total resistance value Rn+Rp of the first parasitic resistance component Rn and second parasitic resistance component Rp is represented by the following expression (II) from the heretofore mentioned expression (I).

$$Rn+Rp=1/(2\pi \times 10^{-12} \times 50 \times 10^{6})=3.2K\Omega \quad (II)$$

In order to reduce the parasitic junction capacitance components C2' (parasitic junction capacitance components corresponding to one side of the high voltage MOSFETs), the total resistance value Rn+Rp of the first parasitic resistance component Rn and second parasitic resistance component Rp is represented by Rn+Rp≥(2π×Cn×fc)$^{-1}$. That is, it is sufficient to set Rn+Rp to 3.2KΩ or more. In this case, for example, in the event that the first parasitic resistance component Rn is set to 2.2KΩ, it is sufficient to set the second parasitic resistance component Rp to 1KΩ or more. Hypothetically, when the width of the p base region 105 is set to 20 μm, in the event that the sheet resistance value of the diffusion resistance of the p base region 105 is 0.5 kΩ/(kΩ/square), it is sufficient that the length of the p base region 105 in which the p$^+$region 113 is not formed can secure a length of on the order to 80 μm or more which is 2 sheets×2 times (as the p$^+$region 113 is disposed on both sides of the high voltage MOSFET, twice the distance is needed). This distance is a practical value without any problem in terms of layout dimensions.

In this way, by adopting a structure in which the p⁺region 113 of the p base region 105 opposite to the n⁻region 101 adjacent to the n⁻drift region 81 of each high voltage MOSFET 71 and 72 of the invention is not locally taken up, it is possible to lower the output capacitance by on the order of approximately 10 to 20% as compared with the output capacitance of the high voltage MOSFETs of the heretofore known example.

The structure in which the p⁺region 113 of the p base region 105 opposite to the n⁻region 101 adjacent to the n⁻drift region 81 is not locally taken up means that the p⁺region 113 is not provided in a region adjacent to the end portion of the n⁺source region 114 in the channel width direction of each MOSFET 71 and 72. Also, it is desirable that the p⁺region 113 is not provided adjacent to the n⁺source region 114 in order to lower the junction capacitances C2', but within a range in which the parasitic capacitances C2' decrease, it is possible to adopt a configuration wherein the p⁺region 113 is not provided in a region close to the n⁺source region 114.

Figure 15:
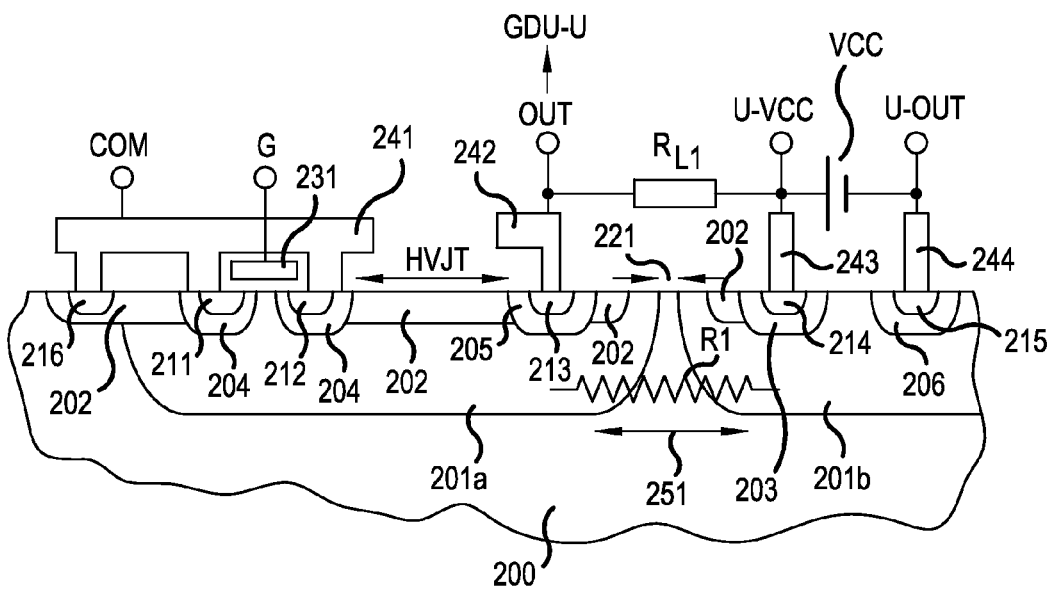
FIG. 15 is a sectional view showing a sectional structure along the section line G-G' of FIG. 14.
Figure 17:
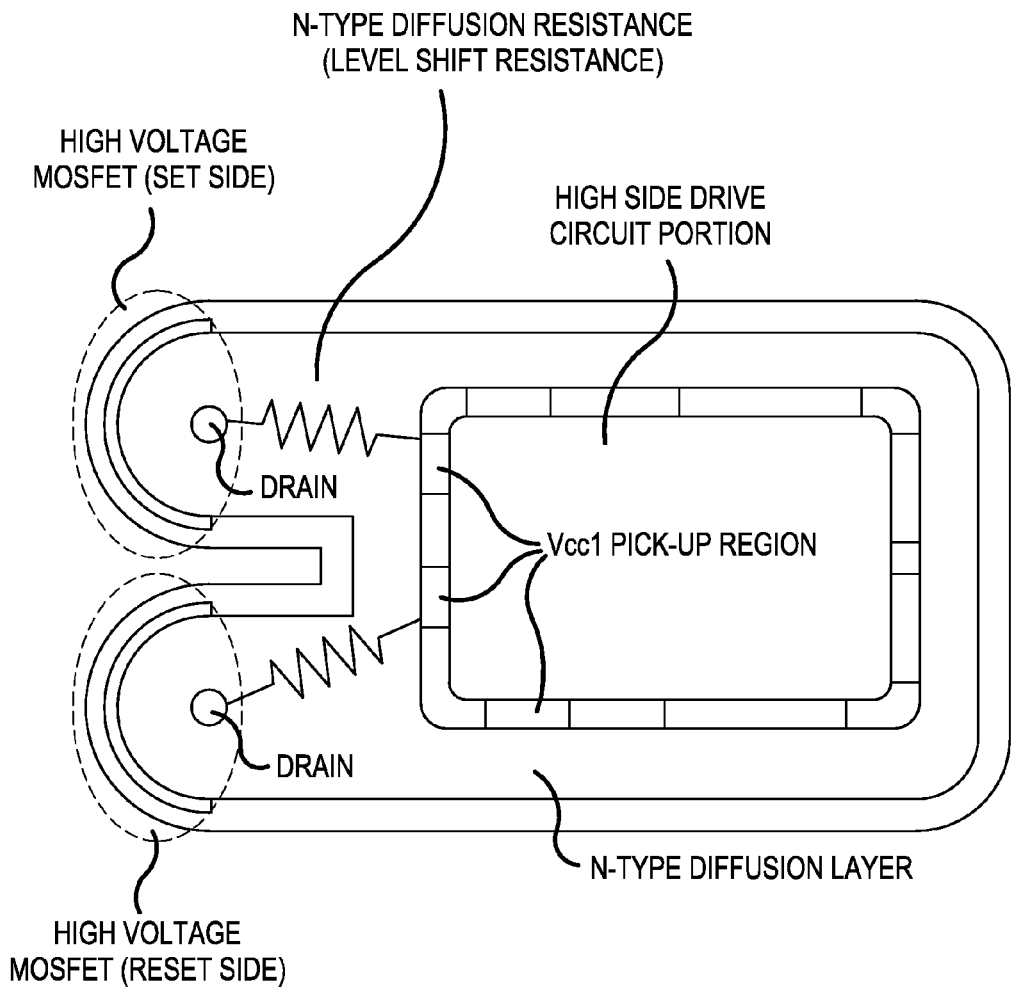
FIG. 17 is a plan view showing another example of the main portion of the high voltage MOSFETs and high side drive circuit of the heretofore known example.

Also, Embodiment 4 has shown a case in which the load resistances are formed between the n⁺drain region 103 and second pick-up region 122, but Embodiment 4 is applicable in the event that a level shift MOSFET is formed in one portion of the breakdown voltage region of the floating circuit region, as in the configuration shown in FIGS. 14 and 15 and the configuration shown in FIG. 17.

As heretofore described, according to Embodiment 4, it is possible to obtain the same advantageous effects as those of Embodiments 1 and 2.

(Embodiment 5)

Figure 12:
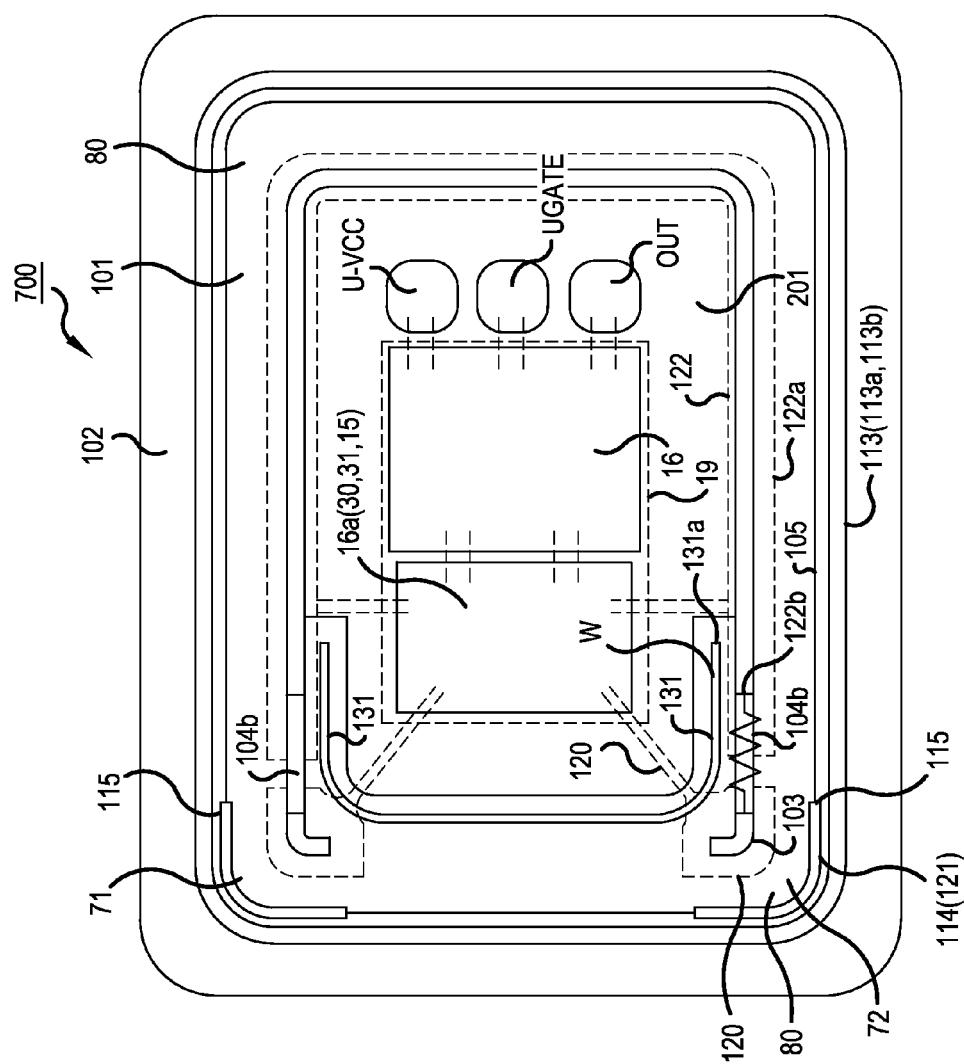
FIG. 12 is a plan view showing a main portion of a high voltage semiconductor device according to Embodiment 5 of the invention.

Next, a description will be given of a structure of a high voltage semiconductor device according to Embodiment 5. FIG. 12 is a plan view showing a main portion of the high voltage semiconductor device 700 according to Embodiment 5 of the invention. The high voltage semiconductor device 700 according to Embodiment 5 is a modification example of the high voltage semiconductor device 400 according to Embodiment 2.

In the above Embodiments 1 to 4, a description has been given of an example wherein the p⁻opening portions 131 are provided one in each of the high voltage MOSFETs 71 and 72, and the combined resistance of the load resistances 104a and 104b or load resistances 104c and 104d is used. However, it is also possible to obtain the same advantageous effects by adopting a structure in which after the p⁻opening portions 131 provided one in each of the high voltage MOSFETs 71 and 72 are combined to form one p⁻opening portion 131, the load resistance 104b is used as a load resistance, as in Embodiment 5. In this case, the load resistance region does not form the combined resistance, meaning that it is possible to reduce the distance between the n⁺drain region 103 and the second pick-up region 122 to on the order of a half.

In the high voltage semiconductor device 700 according to Embodiment 5 shown in FIG. 12, one p⁻opening portion 131 is formed in the form of connecting end portions of the two p⁻opening portions 131 shown in FIG. 3, the distance between which is shorter, but one p⁻opening portion 131 may be formed so as to surround the logic circuit region 19 by connecting end portions of the two p⁻opening portions 131, the distance between which is longer. In this case, the load resistance 104a shown in FIG. 3 is used as a load resistance, and the load resistance 104b is not formed.

As heretofore described, according to Embodiment 5, it is possible to obtain the same advantageous effects as those of Embodiments 1 and 2.

In the above, in the invention, the first conductivity type is made to be the p type, and the second conductivity type is made to be the n type, but the invention holds true even by making the first conductivity type to be the n type and making the second conductivity type to be the p type.

As above, the high voltage semiconductor device according to the invention is useful for a power semiconductor device used in a motor control inverter, as well as in a power source application to a PDP, liquid crystal panel, or the like, an inverter for a home electric appliance such as an air conditioner or lighting unit, power supply equipment with low and medium capacitance, an FPD, a household electrical appliance, or the like.

What is claimed is:

1. A high voltage semiconductor device, comprising:
   a second conductivity type semiconductor region provided on a first conductivity type semiconductor substrate;
   a logic circuit provided in the surface layer of the semiconductor region;
   an insulated gate field effect transistor having a second conductivity type source region provided on the outer peripheral side of the semiconductor region, a gate electrode provided on the semiconductor region via an insulating film, and a second conductivity type drain region provided in the surface layer of the semiconductor region so as to be spaced a predetermined distance from the outer peripheral edge of the semiconductor region;
   a second conductivity type pick-up region provided in the surface layer of the semiconductor region, away from the drain region, so as to be spaced the predetermined distance from the outer peripheral edge of the semiconductor region;
   a first conductivity type opening portion, reaching the semiconductor substrate from the surface of the semiconductor region, provided away from the drain region, second conductivity type pick-up region, and logic circuit, between the logic circuit and a region from the drain region to a portion of the semiconductor region extending to one drain region side portion of the second conductivity type pick-up region via a portion of the semiconductor region sandwiched between the drain region and second conductivity type pick-up region, and
   a load resistance formed of a portion of the semiconductor region sandwiched between the drain region and second conductivity type pick-up region.

2. The high voltage semiconductor device according to claim 1, wherein
   the load resistance is a second conductivity type buffer region, higher in impurity concentration than the semiconductor region, provided in a portion of the semiconductor region sandwiched between the drain region and second conductivity type pick-up region so as to make contact with the drain region and second conductivity type pick-up region.

3. The high voltage semiconductor device according to claim 1, further comprising:
   a first conductivity type base region annularly provided in the outer peripheral side surface layer of the semiconductor region; and
   a first conductivity type pick-up region provided inside the base region, wherein the source region is provided inside the base region.

4. The high voltage semiconductor device according to claim 1, wherein the opening portion is a region wherein the semiconductor substrate is exposed to a surface of the semiconductor region on the side opposite from the semiconductor substrate side.

5. The high voltage semiconductor device according to claim 1, wherein
the opening portion is a first conductivity type diffusion region, higher in impurity concentration than the semiconductor substrate, selectively formed in the surface layer of the semiconductor substrate.

6. A high voltage semiconductor device, comprising:
a second conductivity type semiconductor region provided on a first conductivity type semiconductor substrate;
a logic circuit provided in the surface layer of the semiconductor region;
an insulated gate field effect transistor having a second conductivity type source region provided on the outer peripheral side of the semiconductor region, a gate electrode provided on the semiconductor region via an insulating film, and a second conductivity type drain region provided in the surface layer of the semiconductor region so as to be spaced a predetermined distance from the outer peripheral edge of the semiconductor region;
a second conductivity type pick-up region provided in the surface layer of the semiconductor region, away from the drain region, so as to be spaced the predetermined distance from the outer peripheral edge of the semiconductor region;
a trench, reaching the semiconductor substrate from the surface of the semiconductor region, provided away from the drain region, second conductivity type pick-up region, and logic circuit, between the logic circuit and a region from the drain region to a portion of the semiconductor region extending to one drain region side portion of the second conductivity type pick-up region via a portion of the semiconductor region sandwiched between the drain region and second conductivity type pick-up region;
an insulating body buried in the trench; and
a load resistance formed of a portion of the semiconductor region sandwiched between the drain region and second conductivity type pick-up region.

7. The high voltage semiconductor device according to claim 1, wherein
a configuration is adopted wherein depletion layers extending from the pn junctions into the opening portion make contact with each other before avalanche breakdown occurs in the pn junction of the opening portion and semiconductor region and the pn junction of the semiconductor region and semiconductor substrate.

8. The high voltage semiconductor device according to claim 1, wherein
the semiconductor region is a second conductivity type epitaxial growth layer formed on the semiconductor substrate.

9. The high voltage semiconductor device according to claim 1, wherein
the semiconductor region is formed of a first region in which is provided the logic circuit and a second region surrounding the first region, and
the first region is formed of a first diffusion region, while the second region is formed of a second diffusion region lower in impurity concentration than the first diffusion region.

10. The high voltage semiconductor device according to claim 1, wherein
a first conductivity type offset region is provided inside the semiconductor region so as to surround the logic circuit.

11. The high voltage semiconductor device according to claim 6, wherein
a first conductivity type offset region is provided inside the semiconductor region so as to surround the logic circuit.

12. The high voltage semiconductor device according to claim 3, wherein
a first conductivity type offset region is provided inside the semiconductor region so as to surround the logic circuit, and
the offset region is in contact with the base region or opening portion or with two of them.

13. A high voltage semiconductor device which drives a switching element of which the high potential side terminal is connected to a high voltage power source and the low potential side terminal is connected to an OUT terminal which can take the potential between the high potential and ground potential of the high voltage power source, the device comprising:
a second conductivity type semiconductor region provided on a first conductivity type semiconductor substrate;
a logic circuit provided in the surface layer of the semiconductor region using as a power source a low potential power source with the OUT terminal as a reference;
an insulated gate field effect transistor having a first conductivity type base region annularly provided on the outer peripheral side of the semiconductor region, a second conductivity type source region provided inside the base region, a gate electrode provided on the semiconductor region via an insulating film, and a second conductivity type drain region provided in the surface layer of the semiconductor region so as to be spaced a predetermined distance from the base region;
a second conductivity type pick-up region provided in the surface layer of the semiconductor region, away from the drain region, so as to be spaced a predetermined distance from the base region, and connected on the high potential side of the low potential power source with the OUT terminal as the reference;
a first conductivity type pick-up region provided inside the base region and connected to the ground of a low potential power source with the ground as a reference; and
a region wherein the first conductivity type pick-up region is not formed, and parasitic resistance components Rp are provided, in a region of the source region close in the channel width direction of the insulated gate field effect transistor.

14. The high voltage semiconductor device according to claim 13, wherein
when a junction capacitance existing between the drain region and source region is taken to be C1,
a junction capacitance component existing in parallel with the junction capacitance C1 in the channel width direction of the insulated gate field effect transistor is taken to be Cn (F),
a parasitic resistance component in a portion of the semiconductor region adjacent to a portion of the semiconductor region sandwiched between the drain region and source region is taken to be Rn (W),
the parasitic resistance component is taken to be Rp (W), and
the reciprocal number of a rise time when the insulated gate field effect transistor turns on, the reciprocal number of a fall time when the insulated gate field effect transistor turns off, or the reciprocal number of a period for which a dV/dt surge input into the OUT terminal is being generated, is taken to be fc (Hz), $Rp^3\{1/(2p'Cn'fc)\}$–Rn is satisfied.

15. The high voltage semiconductor device according to claim 14, wherein
- the junction capacitance C1 exists in a portion of the semiconductor region between a drift region sandwiched between the drain region and source region and the first conductivity type pick-up region,
- the junction capacitance components Cn exist in parallel with the junction capacitance C1 via a portion of the semiconductor region adjacent to the drift region,
- the parasitic resistance components Rn, being portions of the semiconductor region other than the drift region, are formed between the drain region and the pn junction of the base region in the region in which the first conductivity type pick-up region is not formed and the semiconductor region, and
- the parasitic resistance components Rp are formed in a portion of the semiconductor region between the base region in the region in which the first conductivity type pick-up region is not formed and the first conductivity type pick-up region.

* * * * *